(12) United States Patent
Adachi

(10) Patent No.: US 8,421,308 B2
(45) Date of Patent: Apr. 16, 2013

(54) VIBRATORY ACTUATOR

(75) Inventor: Yusuke Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 206 days.

(21) Appl. No.: 12/978,671

(22) Filed: Dec. 27, 2010

(65) Prior Publication Data

US 2011/0156536 A1   Jun. 30, 2011

(30) Foreign Application Priority Data

Dec. 25, 2009   (JP) .................................. 2009-293784

(51) Int. Cl.
*H01L 41/08* (2006.01)

(52) U.S. Cl.
USPC ............ 310/323.02; 310/323.12; 310/323.16; 310/328

(58) Field of Classification Search ............. 310/323.02, 310/323.12, 323.1, 6, 328
See application file for complete search history.

(56) References Cited

U.S. PATENT DOCUMENTS

| | | | | |
|---|---|---|---|---|
| 6,081,063 A * | 6/2000 | Kasuga et al. | ........... | 310/323.02 |
| 6,559,574 B2 * | 5/2003 | Maruyama | ............... | 310/323.02 |
| 6,747,397 B2 * | 6/2004 | Maruyama | .................... | 310/328 |
| 7,205,703 B2 * | 4/2007 | Funakubo et al. | ....... | 310/323.02 |
| 7,646,136 B2 * | 1/2010 | Adachi et al. | ............. | 310/323.16 |
| 8,004,150 B2 * | 8/2011 | Adachi et al. | ............. | 310/323.02 |
| 2008/0179996 A1 | 7/2008 | Adachi | | |
| 2008/0278033 A1 * | 11/2008 | Adachi et al. | .................. | 310/317 |
| 2009/0026884 A1 | 1/2009 | Adachi et al. | | |
| 2010/0237743 A1 | 9/2010 | Adachi et al. | | |
| 2010/0244627 A1 * | 9/2010 | Adachi | ..................... | 310/323.02 |
| 2011/0006639 A1 * | 1/2011 | Kashiwaya et al. | ..... | 310/323.02 |

FOREIGN PATENT DOCUMENTS

| JP | 2006-121785 | 5/2006 |
|---|---|---|
| JP | 2006-187112 | 7/2006 |
| JP | 4069160 B2 | 1/2008 |
| JP | 2009-130955 | 6/2009 |

* cited by examiner

*Primary Examiner* — Mark Budd
(74) *Attorney, Agent, or Firm* — Renner, Otto, Boisselle & Sklar, LLP

(57) ABSTRACT

In an ultrasonic actuator, piezoelectric layers and internal electrode layers are stacked. External electrodes are formed on a principal surface exposed to an outside of the outermost piezoelectric layer. Side electrodes connected to the internal electrode layers and the external electrodes are formed on side surfaces of a body including the piezoelectric layers and the internal electrode layers. A first divided electrode and a first external electrode are connected together by a plurality of side electrodes. A second divided electrode and a second external electrode are connected together by a plurality of side electrodes. A minus electrode layer and a third external electrode are connected together by a plurality of side electrodes.

8 Claims, 14 Drawing Sheets

VIBRATORY ACTUATOR

CROSS-REFERENCE TO RELATED APPLICATION

This application claims priority to Japanese Patent Application No. 2009-293784 filed on Dec. 25, 2009, the disclosure of which including the specification, the drawings, and the claims is hereby incorporated by reference in its entirety.

BACKGROUND

The present disclosure relates to a vibratory actuator in which a plurality of piezoelectric layers are stacked.

Conventionally, a vibratory actuator has been known, which includes piezoelectric elements (electromechanical transducer elements), and which is used for various electric devices. Such a vibratory actuator includes a plurality of stacked piezoelectric layers; and internal electrodes, each of which is sandwiched between the piezoelectric layers. In the vibratory actuator, voltage is applied to the piezoelectric layers through the internal electrodes to induce desired vibration in the piezoelectric layers, resulting in an output of drive force.

In, e.g., a vibratory actuator of Japanese Patent No. 4069160, a plurality of piezoelectric layers including internal electrodes formed on principal surfaces thereof are stacked, i.e., the piezoelectric layers and the internal electrodes are alternately stacked. Thus, each of the internal electrodes is sandwiched between two piezoelectric layers. The internal electrode extends to a side surface of the piezoelectric layer. A side electrode is formed on the side surface of the piezoelectric layer, and the internal electrode is connected to the side electrode. When the plurality of piezoelectric layers are stacked, the side electrodes of the piezoelectric layers are connected in the stacking direction to function as a single side electrode. External electrodes through which power is fed from outside are formed on the principal surface of the outermost piezoelectric layer, which is exposed to outside (surface facing the stacking direction). The external electrode extends to and is connected to the side electrode positioned on the side surface of the piezoelectric layer. That is, the external electrode is in conduction with the internal electrodes through the side electrode. A wire is connected to the external electrode. In the vibratory actuator configured as described above, voltage is applied from outside to the vibratory actuator through the wires, thereby applying such voltage to the internal electrodes through the external and side electrodes.

SUMMARY

In the vibratory actuator of Japanese Patent No. 4069160, the external and side electrodes are formed in the principal and side surfaces which are outer surfaces of the body in which the plurality of piezoelectric layers and the internal electrodes are stacked. The external and side electrodes are connected together at an edge defined by the principal and side surfaces. However, such an edge is easily chipped off due to, e.g., an impact from outside. A connecting part between the external and side electrodes are also easily chipped off, and therefore there are possibilities that resistance is increased between the external and side electrodes, and the wire is disconnected. The damageable electrodes result in degradation of reliability of an ultrasonic actuator.

The present disclosure has been made in view of the foregoing, and it is an object of the present disclosure to reduce or prevent the degradation of the reliability of the vibratory actuator due to the damage in the connecting part between the external and side electrodes.

The present disclosure is intended for a vibratory actuator including a body including a plurality of piezoelectric layers stacked in a stacking direction; and internal electrodes, each of which is sandwiched between the piezoelectric layers. External electrodes through which power is fed from outside are provided on a principal surface exposed to an outside of the outermost piezoelectric layer. The body has side surfaces which are parallel to the stacking direction, and side electrodes provided on the side surfaces. The side electrodes are connected to the internal electrodes, and are connected to the external electrode at an edge defined by the side surface and the principal surface on which the external electrode is provided. The internal and external electrodes which are at the same potential are connected together by a plurality of side electrodes.

According to the present disclosure, even if one connecting part between the external and side electrodes is damaged due to damage at the edge, the connection between the external and side electrodes can be maintained in another connecting part. Thus, the reliability of the ultrasonic actuator can be improved.

DETAILED DESCRIPTION

Example embodiments of the present disclosure will be described in detail below with reference to the drawings.

Embodiments of the Disclosure

Figure 1:
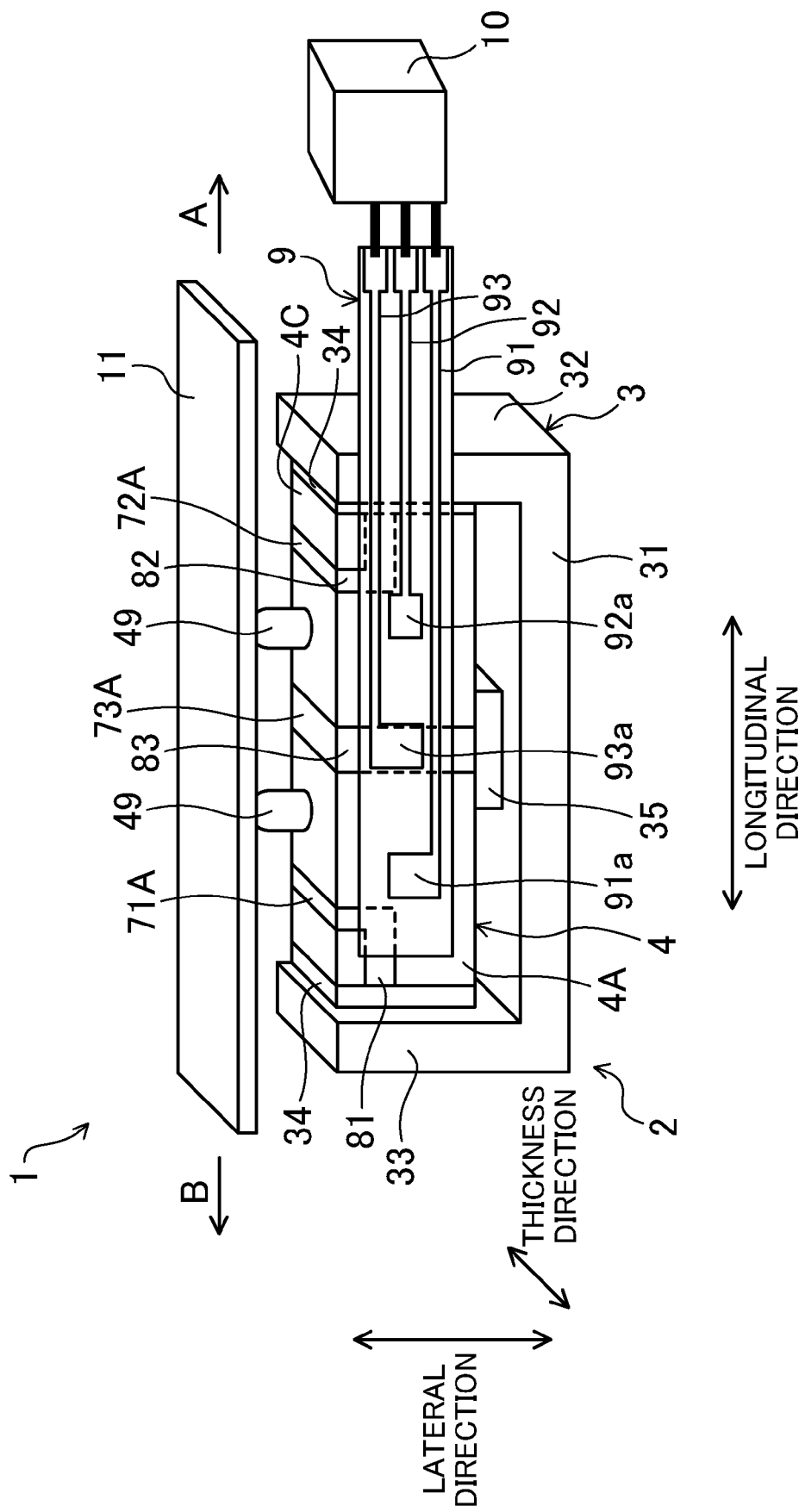
FIG. 1 is a perspective view of a drive unit of an embodiment of the present disclosure.
Figure 2:
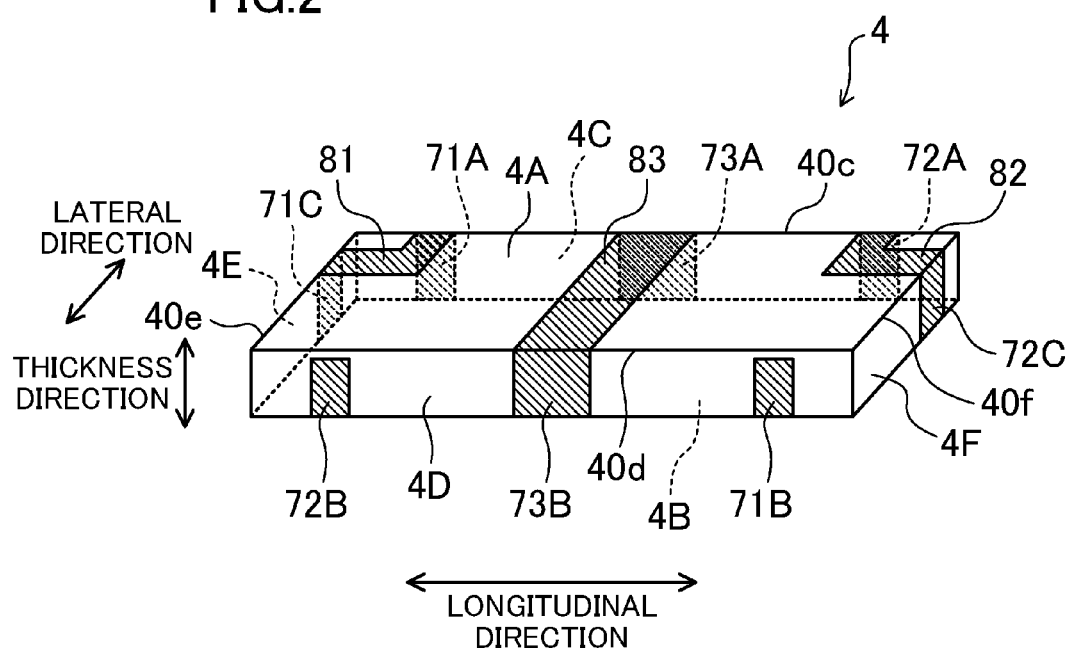
FIG. 2 is a perspective view of an actuator body.

FIG. 1 is a view schematically illustrating a configuration of a drive unit 1 of an embodiment, and FIG. 2 is a perspective view of an actuator body 4. As illustrated in FIG. 1, the drive unit 1 includes a stage 11, an ultrasonic actuator 2, and a control unit 10 for controlling a drive of the ultrasonic actuator 2.

The stage 11 is slidably attached to a guide (not shown in the figure). That is, the stage 11 is slidable in a direction in which the guide extends (direction indicated by arrows A and B in the figure) (the direction in which the guide extends is equivalent to a movable direction of the stage 11). The stage 11 is a substantially rectangular plate-like member as viewed in plan. The ultrasonic actuator 2 is arranged so as to contact driver elements 49 (described later) on a back surface of the stage 11.

The ultrasonic actuator 2 includes the actuator body 4 generating vibration; the driver elements 49 transmitting drive force of the actuator body 4 to the stage 11; a case 3 in which the actuator body 4 is accommodated; support rubber blocks 34 which are interposed between the actuator body 4 and the case 3 to elastically support the actuator body 4; and a biasing rubber block 35 for biasing the actuator body 4 toward the stage 11. The ultrasonic actuator 2 serves as a vibratory actuator.

The actuator body 4 includes piezoelectric elements. The actuator body 4 is formed in substantially rectangular parallelepiped shape. The actuator body 4 has a pair of substantially rectangular principal surfaces 4A and 4B facing each other; a pair of long-side surfaces 4C and 4D which extend in the longitudinal direction of the principal surfaces 4A and 4B so as to be perpendicular to the principal surfaces 4A and 4B, and which face each other; and a pair of short-side surfaces 4E and 4F which extend in the lateral direction of the principal surfaces 4A and 4B so as to be perpendicular to the principal surfaces 4A and 4B and the long-side surfaces 4C and 4D, and which face each other. The principal surfaces 4A and 4B are surfaces facing a stacking direction of piezoelectric layers 41 (described later), and are principal surfaces of the piezoelectric layers 41. The long-side surfaces 4C and 4D and the short-side surfaces 4E and 4F are side surfaces formed along edges of the principal surfaces 4A and 4B, and are parallel to the stacking direction of the piezoelectric layers 41. The actuator body 4 harmonically generates stretching and bending vibrations, and then outputs the drive force in a drive direction along the longitudinal direction (detail will be described later).

Two driver elements 49 (not shown in FIG. 2) are provided on the long-side surface (hereinafter referred to as an "installation surface") 4C of the actuator body 4.

The driver element 49 is formed in cylindrical shape. A tip of the driver element 49 is formed in hemispherical shape. The driver element 49 is made of, e.g., zirconia, alumina, silicon nitride, silicon carbide, and tungsten carbide. The driver elements 49 are attached to the installation surface 4C of the actuator body 4 with an adhesive.

It is desired to use material softer than materials of the actuator body 4 and the driver element 49 as the adhesive. Specifically, the adhesive may be made of synthetic resin such as epoxy resin and silicone resin. Such material is used to possibly reduce hindrance to vibration (described later) of the actuator body 4, thereby ensuring fixing between each of the driver elements 49 and the installation surface 4C.

The driver elements 49 are attached to the installation surface 4C at a distance of 30-35% of the length of the installation surface 4C inwardly from both ends of the actuator body 4 in the longitudinal direction, i.e., at positions corresponding to antinodes of second-order bending vibration (described later) of the actuator body 4, where the maximum vibration occurs.

The case 3 is made of resin, and is formed in substantially U-shape corresponding to the actuator body 4. The case 3 includes a long-side wall 31; a first short-side wall 32 provided at one end of the long-side wall 31; and a second short-side wall 33 provided at the other end of the long-side wall 31.

The actuator body 4 is accommodated in the case 3 configured as described above. The actuator body 4 is accommodated in the case 3 so that the long-side surface of the actuator body 4, to which the driver elements 49 are not attached faces the long-side wall 31 of the case 3. The biasing rubber block 35 is interposed between the long-side surface of the actuator body 4 and the long-side wall 31 of the case 3. In such a state, the driver elements 49 protrude from the case 3. One of the support rubber block 34 is interposed between one of the short-side surfaces of the actuator body 4 and the first short-side wall 32 of the case 3, and the other support rubber block 34 is interposed between the other short-side surface of the actuator body 4 and the second short-side wall 33 of the case 3. Both of the short-side surfaces of the actuator body 4 correspond to antinodes of longitudinal vibration (described later). Since the support rubber blocks 34 are elastic bodies, the actuator body 4 can be supported without reducing the longitudinal vibration of the actuator body 4.

Instead of the support rubber block 34 and the biasing rubber block 35, elastic bodies such as plate springs may be employed.

In the ultrasonic actuator 2 configured as described above, the case 3 is fixed to a base (not shown in the figure) with the driver elements 49 contacting the back surface of the stage 11. Specifically, the ultrasonic actuator 2 is arranged so that the lateral direction of the actuator body 4 is perpendicular to the back surface of the stage 11, and the longitudinal direction of the actuator body 4 is parallel to the back surface of the stage 11 and to the movable direction of the stage 11. In other words, the ultrasonic actuator 2 is arranged so that a direction of the bending vibration of the actuator body 4 is perpendicular to the back surface of the stage 11, and a direction of the longitudinal vibration of the actuator body 4 faces the movable direction of the stage 11.

In such a case, the biasing rubber block 35 is compressed and deformed. The driver elements 49 are biased toward the stage 11 by elastic force of the biasing rubber block 35. The biasing force of the ultrasonic actuator 2 toward the stage 11 depends on the elastic force of the biasing rubber block 35.

When receiving an operation command from outside, the control unit 10 applies AC voltage having frequencies corresponding to the operation command, to the actuator body 4 so as to have a phase difference corresponding to the operation command. The control unit 10 is connected to the ultrasonic actuator 2 through a flexible printed board 9. That is, the control unit 10 harmonically generates the longitudinal and bending vibrations in the actuator body 4 to provide orbit motion of the driver elements 49, thereby moving the stage 11.

Figure 3:
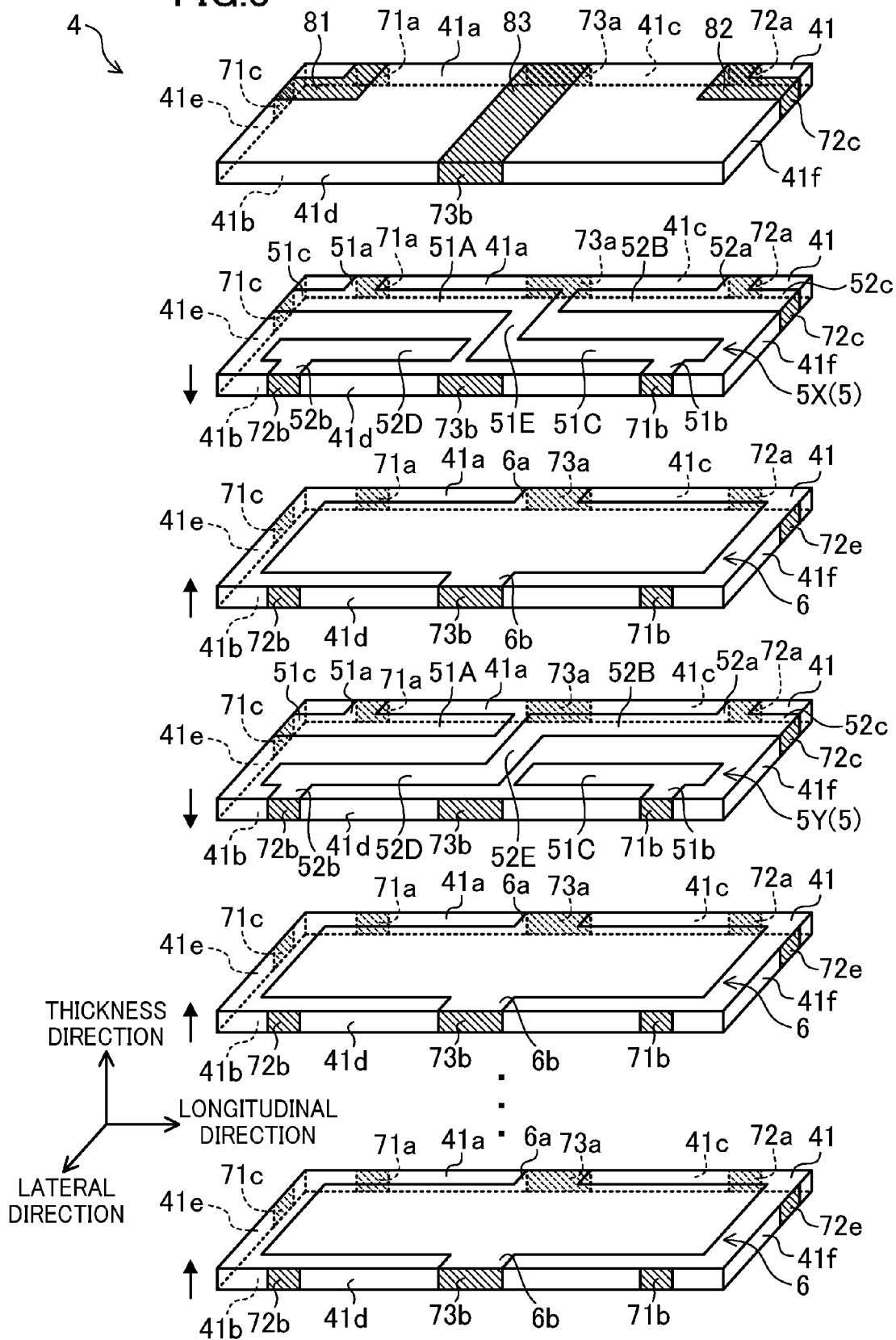
FIG. 3 is an exploded perspective view of the actuator body.
Figure 4:
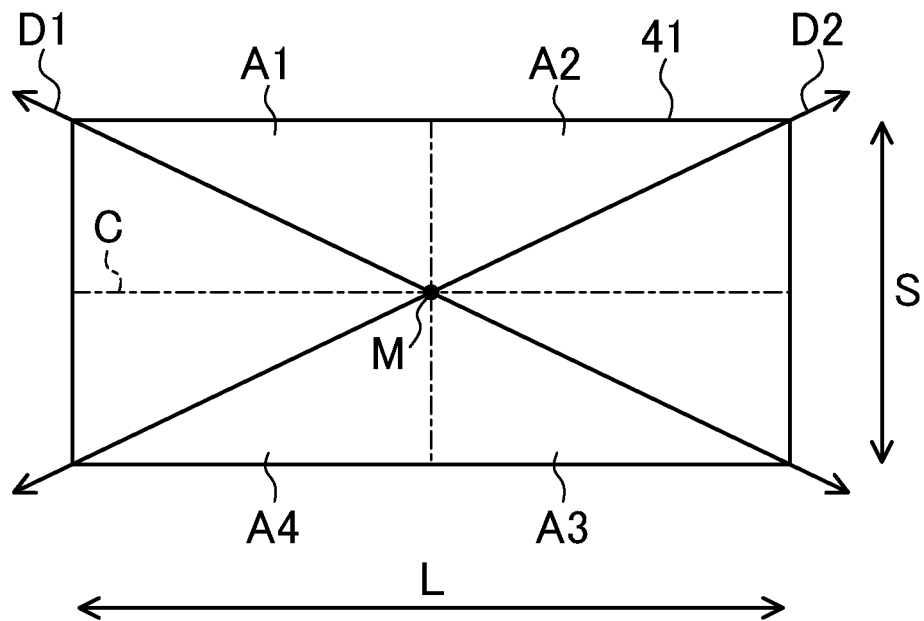
FIG. 4 is a view of a principal surface of a piezoelectric layer, which illustrates a shape of the piezoelectric layer.

Next, a configuration of the actuator body 4 will be described in more detail with reference to FIGS. 3 and 4. FIG. 3 is an exploded perspective view of the actuator body 4, and FIG. 4 is a view of the principal surface of the piezoelectric layer, which illustrates a shape of the piezoelectric layer.

As illustrated in FIG. 3, the actuator body 4 is configured by alternately stacking a plurality of piezoelectric layers 41 and a plurality of internal electrode layers 5 and 6. The actuator body 4 forms a body.

The piezoelectric layer 41 is an insulating layer made of ceramic material such as lead zirconate titanate, zirconia, alumina, and silicon nitride. As in the actuator body 4, the piezoelectric layer 41 is formed in substantially rectangular parallelepiped shape; and has a pair of principal surfaces 41a and 41b, a pair of long-side surfaces 41c and 41d, and a pair of short-side surfaces 41e and 41f. Among the principal surfaces 41a and 41b, the long-side surfaces 41c and 41d, and the short-side surfaces 41e and 41f, the principal surfaces 41a and 41b have the maximum area. The long-side surfaces 41c and 41d and the short-side surfaces 41e and 41f are side surfaces formed along edges of the principal surfaces 41a and 41b. The piezoelectric layer 41 is polarized in a direction facing the pair of principal surfaces 41a and 41b (i.e., thickness direction).

A plurality of side electrodes are formed on the side surfaces of the piezoelectric layer 41. Specifically, on the long-side surface 41c, a first side electrode 71a is formed in one of end sections in the longitudinal direction of the actuator body 4; a third side electrode 73a is formed in a middle section in the longitudinal direction; and a second side electrode 72a is formed in the other end section in the longitudinal direction. On the long-side surface 41d, a second side electrode 72b is formed in one of end sections in the longitudinal direction of the actuator body 4; a third side electrode 73b is formed in a middle section in the longitudinal direction; and a first side electrode 71b is formed in the other end section in the longitudinal direction. On the short-side surface 41e, a first side electrode 71c is formed in one of end sections in the lateral direction of the actuator body 4. On the short-side surface 41f, a second side electrode 72c is formed in one of end sections in the lateral direction of the actuator body 4. The side electrodes 71a-73b are formed on the side surfaces of the piezoelectric layer 41 by a method including, e.g., baking, spraying, and sputtering of metal such as gold, silver, and palladium.

The internal electrode layers 5 and 6 form a plus electrode layer 5 and a minus electrode layer 6 which are alternately arranged with the piezoelectric layer 41 being interposed therebetween in the stacking direction. In other words, each of the plus electrode layer 5 and the minus electrode layer 6 is sandwiched between the piezoelectric layers 41. Each of the plus electrode layer 5 and the minus electrode layer 6 is an electrode layer made of metal mainly containing, e.g., silver and palladium. The plus electrode layer 5 and the minus electrode layer 6 are insulted from each other, and are not in conduction with each other. The plus electrode layers 5 and the minus electrode layers 6 serves as internal electrodes.

Each of the plus electrode layer 5 and the minus electrode layer 6 is printed on the principal surface 41a of the piezoelectric layer 41. The piezoelectric layer 41 on which the plus electrode layer 5 is printed, and the piezoelectric layer 41 on which the minus electrode layer 6 is printed are alternately stacked so that the surfaces on which the electrode layers are printed face one direction (in FIG. 3, the surfaces face upwardly). Thus, the plus electrode layer 5 and the minus electrode layer 6 are alternately arranged with the piezoelectric layer 41 being interposed therebetween. In such a configuration, the plus electrode layer 5 is positioned on the principal surface 41a (41b) of the piezoelectric layer 41, and the minus electrode layer 6 is positioned on the principal surface 41b (41a) of the piezoelectric layer 41. The piezoelectric layer 41 is sandwiched between the plus electrode layer 5 and the minus electrode layer 6 in the stacking direction. However, in the adjacent piezoelectric layers 41, the positions of the plus electrode layer 5 and the minus electrode layer 6 in the stacking direction are opposite. Specifically, as illustrated in FIG. 3, in the second top piezoelectric layer 41, the plus electrode layer 5 is positioned on the upper principal surface 41a, and the minus electrode layer 6 is positioned on the lower principal surface 41b. On the other hand, in the third top piezoelectric layer 41 adjacent to the second top piezoelectric layer 41, the minus electrode layer 6 is positioned on the upper principal surface 41a, and the plus electrode layer 5 is positioned on the lower principal surface 41b. The piezoelectric layer 41 is polarized in a direction from the plus electrode layer 5 to the minus electrode layer 6. In other words, when applying forward voltage in the polarization direction of the piezoelectric layer 41, an electrode layer to be on the plus side, i.e., to be a positive electrode is the plus electrode layer 5, whereas an electrode layer to be on the minus side, i.e., to be a negative electrode is the minus electrode layer 6.

The outermost layers of the actuator body 4 are configured so that the plus electrode layer 5 and the minus electrode layer 6 are not exposed. That is, the plus electrode layer 5 or the minus electrode layer 6 is provided between the outermost piezoelectric layer 41 of the actuator body 4 and an adjacent piezoelectric layer 41, but neither the plus electrode layer 5 nor the minus electrode layer 6 are not provided on the outwardly-facing principal surface 41a (41b) of the outermost piezoelectric layer 41. As illustrated in, e.g., FIG. 3, in the outermost layer on an upper side of the actuator body 4, the piezoelectric layer 41 on which the plus and minus electrode layers 5 and 6 are not formed is provided so as to cover the plus electrode layer 5 of the second outermost piezoelectric layer 41. On the other hand, in the outermost layer on a lower side of the actuator body 4, the piezoelectric layer 41 on which the minus electrode layer 6 is formed is provided, and another piezoelectric layer 41 on which the plus and minus electrode layers 5 and 6 are not formed is not provided. The minus electrode layer 6 is provided on the principal surface 41a of the principal surfaces 41a and 41b of the outermost piezoelectric layer 41, which faces the second outermost piezoelectric layer 41, and therefore the minus electrode layer 6 is not exposed to outside. Thus, the outermost piezoelectric layer 41 on the lower side is the piezoelectric layer 41 on which the minus electrode layer 6 is provided.

As illustrated in FIG. 4, the principal surface 41a of the piezoelectric layer 41 is divided into four areas A1-A4, i.e., two areas in a longitudinal direction L and two areas in a lateral direction S. The plus electrode layer 5 includes first divided electrodes 51A and 51C which are arranged in one of pairs of diagonally-aligned areas of the areas A1-A4; and second divided electrodes 52B and 52D which are arranged in the other pair of the diagonally-aligned areas. The first divided electrodes 51A and 51C serve as first electrodes, and the second divided electrodes 52B and 52D serve as second electrodes arranged in a pattern different from that of the first divided electrodes 51A and 51C. Each of the divided electrodes is formed in substantially rectangular shape. The plus electrode layer 5 includes a plus electrode layer 5X having a first pattern in which the first divided electrodes 51A and 51C are connected together through a connection electrode 51E, and in which the second divided electrodes 52B and 52D are separately arranged; and a plus electrode layer 5Y having a second pattern in which the second divided electrodes 52B and 52D are connected together through a connection electrode 52E, and in which the first divided electrodes 51A and 51C are separately arranged. Such electrode layers are simply referred to as the "plus electrode layers 5" below when the first and second patterns are not distinguished from each other.

Lead electrodes 51a-52c extending to edges, i.e., the side surfaces of the piezoelectric layer 41 are provided in the divided electrodes 51A-52D, respectively.

Specifically, the first divided electrode 51A includes the lead electrode 51a extending from a longer side of the first divided electrode 51A adjacent to the long-side surface 41c of the piezoelectric layer 41 to the first side electrode 71a of the long-side surface 41c; and the lead electrode 51c extending from a shorter side of the first divided electrode 51A adjacent to the short-side surface 41e of the piezoelectric layer 41 to the first side electrode 71c of the short-side surface 41e. That is, the first divided electrode 51A is connected to the first side electrode 71a through the lead electrode 51a, and is connected to the first side electrode 71c through the lead electrode 51c. In addition, the first divided electrode 51C includes the lead electrode 51b extending from a long-side section of the first divided electrode 51C adjacent to the long-side surface 41d of the piezoelectric layer 41 to the first side electrode 71b of the long-side surface 41d. That is, the first divided electrode 51C is connected to the first side electrode 71b through the lead electrode 51b.

The second divided electrode 52B includes the lead electrode 52a extending from a long-side section of the second divided electrode 52B adjacent to the long-side surface 41c of the piezoelectric layer 41 to the second side electrode 72a of the long-side surface 41c; and the lead electrode 52c extending from a short-side section of the second divided electrode 52B adjacent to the short-side surface 41f of the piezoelectric layer 41 to the second side electrode 72c of the short-side surface 41f. That is, the second divided electrode 52B is connected to the second side electrode 72a through the lead electrode 52a, and is connected to the second side electrode 72c through the lead electrode 52c. In addition, the second divided electrode 52D includes the lead electrode 52b extending from a long-side section of the second divided electrode 52D adjacent to the long-side surface 41d of the piezoelectric layer 41 to the second side electrode 72b of the long-side surface 41d. That is, the second divided electrode 52D is connected to the second side electrode 72b through the lead electrode 52b.

The minus electrode layer 6 is formed across a substantially entire area of the principal surface 41a of the piezoelectric layer 41, and is formed in rectangular shape. The minus electrode layer 6 serves as an opposite electrode. The minus electrode layer 6 serves as a first opposite electrode facing the first divided electrodes 51A and 51C with the piezoelectric layer 41 being interposed therebetween, and also serves as a second opposite electrode facing the second divided electrodes 52B and 52D with the piezoelectric layer 41 being interposed therebetween. Although the minus electrode layer 6 is overlapped with the first and second divided electrodes 51A-52D as viewed in the stacking direction, the minus electrode layer 6 is provided so as not to be overlapped with the lead electrodes 51a-52c in a section along edges of the principal surface 41a. The minus electrode layer 6 includes a lead electrode 6a extending from a middle section of one of long sides of the minus electrode layer 6 to the third side electrode 73a of the long-side surface 41c of the piezoelectric layer 41; and a lead electrode 6b extending from a middle section of the other long side of the minus electrode layer 6 to the third side electrode 73b of the long-side surface 41d of the piezoelectric layer 41. That is, the minus electrode layer 6 is connected to the third side electrode 73a through the lead electrode 6a, and is connected to the third side electrode 73b through the lead electrode 6b.

The lead electrodes 51a-52c of the plus electrode layer 5 are not overlapped with the minus electrode layer 6 and the lead electrodes 6a and 6b of the minus electrode layer 6 as viewed in the stacking direction. Thus, an electric field in the thickness direction of the piezoelectric layer 41 is not generated in sections of the piezoelectric layer 41 corresponding to the lead electrodes 51a-52c, 6a, and 6b, resulting in the piezoelectrically-inactive sections.

When stacking the piezoelectric layers 41 configured as described above, the first to third side electrodes 71a-73b formed on the side surfaces of the piezoelectric layers 41 are connected together in the stacking direction, and the integrally-connected first to third side electrodes 71A-73B are formed on the side surfaces of the body of the piezoelectric layers 41, i.e., the actuator body 4. Specifically, as illustrated in FIG. 2, on the long-side surface 4C of the actuator body 4, the followings are formed: a first side electrode 71A formed by connecting a plurality of first side electrodes 71a as a single group; a third side electrode 73A formed by connecting a plurality of third side electrodes 73a as a single group; and a second side electrode 72A formed by connecting a plurality of second side electrodes 72a as a single group. On the long-side surface 4D of the actuator body 4, the followings are formed: a second side electrode 72B formed by connecting a plurality of second side electrodes 72b as a single group; a third side electrode 73B formed by connecting a plurality of third side electrodes 73b as a single group; and a first side electrode 71B formed by connecting a plurality of first side electrodes 71b as a single group. On the short-side surface 4E of the actuator body 4, a first side electrode 71C is formed by connecting a plurality of first side electrodes 71c as a single group. On the short-side surface 4F of the actuator body 4, a second side electrode 72C is formed by connecting a plurality of second side electrodes 72c as a single group.

As a result, the first divided electrodes 51A provided on the different piezoelectric layers 41 are in conduction with each other through the first side electrode 71A and the first side electrode 71C. In addition, the first divided electrodes 51C provided on the different piezoelectric layers 41 are in conduction with each other through the first side electrode 71B. Further, in the plus electrode layer 5X having the first pattern, the first divided electrodes 51A and 51C are in conduction with each other through the connection electrode 51E. That is, the first divided electrodes 51A and 51C in the plus electrode layer 5Y having the second pattern are in conduction with each other through the first side electrodes 71A, 71B, and 71C, and the plus electrode layer 5X having the first pattern.

Similarly, the second divided electrodes 52B provided on the different piezoelectric layers 41 are in conduction with each other through the second side electrodes 72A and 72C. In addition, the second divided electrodes 52D provided on the different piezoelectric layers 41 are in conduction with each other through the second side electrode 72B. Further, in the plus electrode layer 5Y having the second pattern, the second divided electrodes 52B and 52D are in conduction with each other through the connection electrode 52E. That is, the second divided electrodes 52B and 52D in the plus electrode layer 5X having the first pattern are in conduction with each other through the second side electrodes 72A, 72B, and 72C, and the plus electrode layer 5Y having the second pattern.

Further, the minus electrode layers 6 provided in the principal surfaces 41a of the different piezoelectric layers 41 are in conduction with each other through the third side electrodes 73A and 73B.

The followings are formed on the principal surface 41a exposed to an outside of the outermost piezoelectric layer 41 of the actuator body 4 (i.e., the principal surface 4A of the actuator body 4): a first external electrode 81 through which power is fed to the first divided electrodes 51A and 51C; a second external electrode 82 through which power is fed to the second divided electrodes 52B and 52D; and a third external electrode 83 through which power is fed to the minus electrode layers 6. The first to third external electrodes 81-83 are formed on the principal surface 41a of the piezoelectric layer 41 by the method including, e.g., baking, spraying, and sputtering of metal such as gold, silver, and palladium. The first to third external electrodes 81-83 are arranged so as to be symmetrical about a line passing through the center of gravity of the principal surface 4A of the actuator body 4, and extending in the lateral direction.

As illustrated in FIG. 2, the first external electrode 81 is formed in L-shape in one of corner sections of the principal surface 4A of the actuator body 4. One end of the first external electrode 81 is connected to the first side electrode 71A of the long-side surface 4C, and the other end is connected to the first side electrode 71C of the short-side surface 4E. Specifically, the first external electrode 81 and the first side electrode 71A are connected together at a long-side edge 40c defined by the principal surface 4A and the long-side surface 4C of the actuator body 4. In addition, the first external electrode 81 and the first side electrode 71C are connected together at a short-side edge 40e defined by the principal surface 4A and the short-side surface 4E of the actuator body 4. The first external electrode 81 and the first side electrodes 71A and 71C connected together as described above are formed so as to cross the two edges 40c and 40e. Thus, the first external electrode 81 is in conduction with the first divided electrodes 51A and 51C through the two first side electrodes 71A and 71C.

The second external electrode 82 is formed in L-shape in a corner section of the actuator body 4 other than the corner section where the first external electrode 81 is positioned (corner section on an opposite side in the longitudinal direction). One end of the second external electrode 82 is connected to the second side electrode 72A of the long-side surface 4C, and the other end is connected to the second side electrode 72C of the short-side surface 4F. Specifically, the second external electrode 82 and the second side electrode 72A are connected together at the long-side edge 40c defined by the principal surface 4A and the long-side surface 4C of the actuator body 4. In addition, the second external electrode 82 and the second side electrode 72C are connected together at a short-side edge 40f defined by the principal surface 4A and the short-side surface 4F of the actuator body 4. The second external electrode 82 and the second side electrodes 72A and 72C connected together as described above are formed so as to cross the two edges 40c and 40f. Thus, the second external electrode 82 is in conduction with the second divided electrodes 52B and 52D through the two second side electrodes 72A and 72C.

The third external electrode 83 is linearly formed so as to laterally extend in the middle section of the principal surface 4A of the actuator body 4 in the longitudinal direction. One end of the third external electrode 83 is connected to the third side electrode 73A of the long-side surface 4C, and the other end is connected to the third side electrode 73B of the long-side surface 4D. Specifically, the third external electrode 83 and the third side electrode 73A are connected together at the long-side edge 40c defined by the principal surface 4A and the long-side surface 4C of the actuator body 4. In addition, the third external electrode 83 and the third side electrode 73B are connected together at a long-side edge 40d defined by the principal surface 4A and the long-side surface 4D of the actuator body 4. The third external electrode 83 and the third side electrodes 73A and 73B connected together as described above are formed so as to cross the two edges 40c and 40d. Thus, the third external electrode 83 is in conduction with the minus electrode layers 6 through the two third side electrodes 73A and 73B.

In the actuator body 4 configured as described above, the first to third external electrodes 81-83 are exposed to outside. Power is fed to the actuator body 4 by using the first to third external electrodes 81-83 as power feeding terminals. Specifically, as illustrated in FIG. 1, the flexible printed board 9 is connected to the first to third external electrodes 81-83 on the principal surface 4A of the actuator body 4. The flexible printed board 9 serves as a power feeding line. The flexible printed board 9 includes three conductive wires 91-93. Terminal sections 91a-93a of the conductive wires 91-93 are connected to the first to third external electrodes 81-83 through an anisotropic conductive film (ACF), respectively. Connecting parts between the first to third external electrodes 81-83 and the terminal sections 91a-93a of the flexible printed board 9 are positioned corresponding to nodes of the bending vibration of the actuator body 4. The connecting part between the third external electrode 83 and the terminal section 93a of the flexible printed board 9 is also positioned corresponding to a node of the stretching vibration of the actuator body 4. The flexible printed board 9 is also connected to the control unit 10. That is, the control unit 10 feeds power to the actuator body 4 through the flexible printed board 9.

Figure 5:
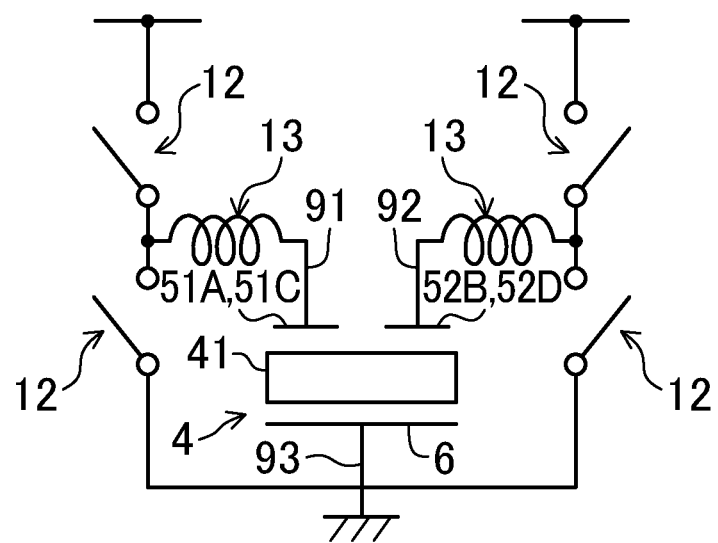
FIG. 5 is a diagram of a half-bridge circuit configuring a part of the drive unit.
Figure 6:
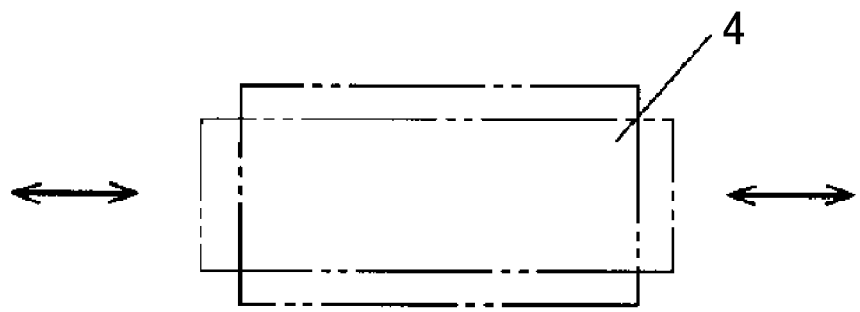
FIG. 6 is a conceptual diagram illustrating a displacement of the actuator body by first-order stretching vibration.
Figure 7:
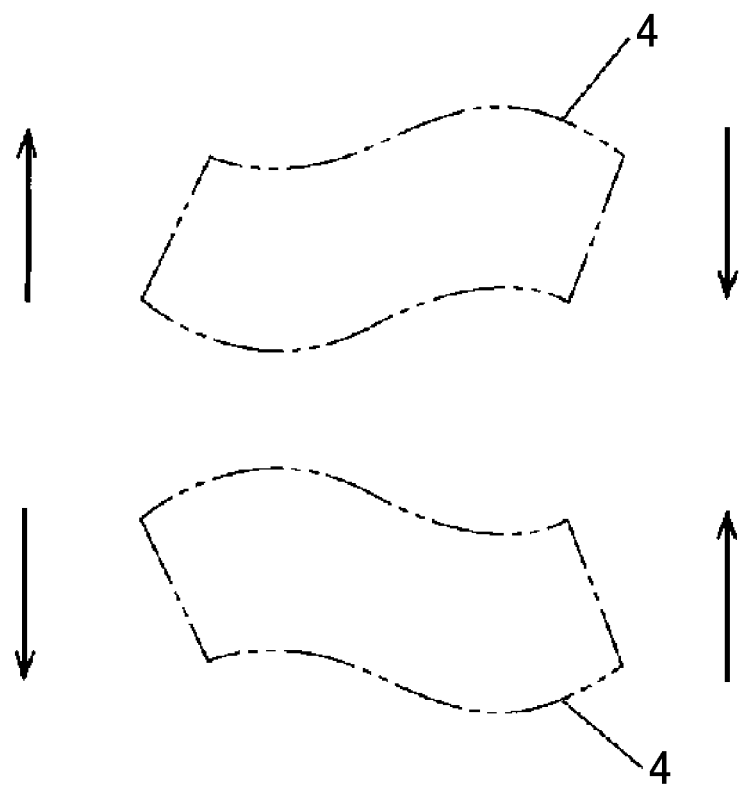
FIG. 7 is a conceptual diagram illustrating a displacement of the actuator body by second-order bending vibration.
Figure 8A:
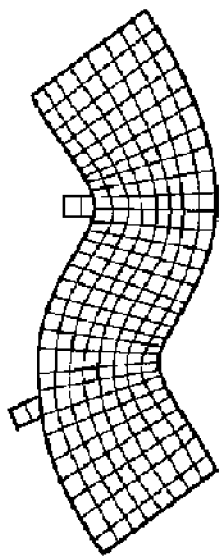
FIGS. 8(A)-8(D) are conceptual diagrams illustrating a displacement of the actuator body by composite vibration of the first-order stretching vibration and the second-order bending vibration.
Figure 8B:
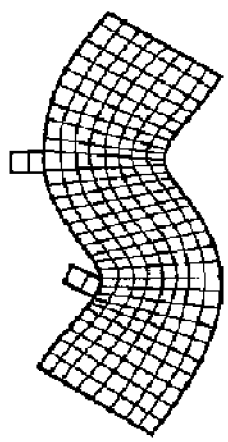
Figure 8C:
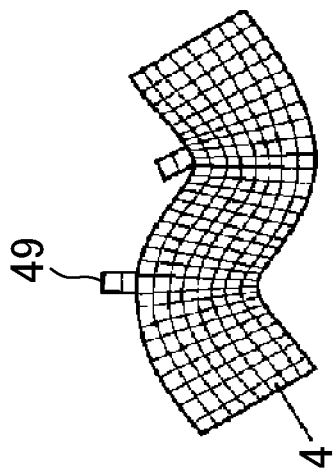
Figure 8D:
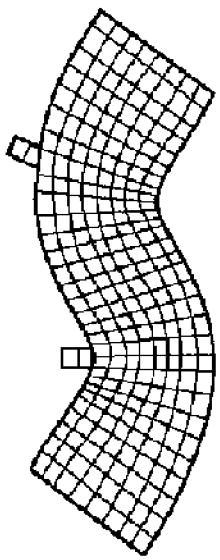

Next, a configuration of the control unit 10 and an operation of the actuator body 4 will be described with reference to FIGS. 5-8. FIG. 5 is a diagram of a half-bridge circuit configuring a part of the control unit 10; FIG. 6 is a diagram illustrating a displacement of the actuator body by first-order stretching vibration; FIG. 7 is a diagram illustrating a displacement of the actuator body by second-order bending vibration; and FIGS. 8(A)-8(D) are diagrams illustrating a displacement of the actuator body by composite vibration of the first-order stretching vibration and the second-order bending vibration.

The control unit 10 includes four switches 12 and two coils 13, and two half-bridge circuits are formed. Voltage having the same voltage value as that of power-supply voltage and having rectangular waves is outputted through the half-bridge circuit. The piezoelectric layer 41 is connected among the coils 13 and the half-bridge circuits. A low-pass filter is formed by capacitance of the piezoelectric layer 41 and inductance of the coil 13, and drive voltage having sine waves is applied to the piezoelectric layer 41. A cutoff frequency of the low-pass filter formed by the inductance of the coil 13 and the capacitance of the piezoelectric layer 41 is preferably higher than a drive frequency of the ultrasonic actuator 2.

The control unit 10 includes a CPU (not shown in the figure), and the switches 12 are switched by the CPU to apply drive voltage having two-phase sine waves to the piezoelectric layer 41 by the two half-bridge circuits and the two coils 13. Specifically, the control unit 10 generates first drive voltage having sine waves by the first half-bridge circuit and the first coil 13, and then the drive voltage is applied between each of the first divided electrodes 51A and 51C of the piezoelectric layer 41 and the minus electrode layer 6. On the other hand, the control unit 10 generates second drive voltage by the second half-bridge circuit and the second coil 13, and then the drive voltage is applied between each of the second divided electrodes 52B and 52D of the piezoelectric layer 41 and the minus electrode layer 6. Although the two-channel half-bridge circuit in which the first and second drive voltages are generated has been described in the present embodiment, power-supply circuits including a two-channel full-bridge circuit or a circuit using an amplifier may be applied. However, if the full-bridge circuit is applied, it is necessary to divide the minus electrode layer 6 into a minus electrode layer facing the first divided electrodes 51A and 51C and a minus electrode layer facing the second divided electrodes 52B and 52D.

The control unit 10 induces various vibrations in the actuator body 4 by adjusting voltage values, frequencies, and phases of the first and second AC voltages. By changing a gate signal of the half-bridge circuit, the control unit 10 changes the frequencies of the first and second drive voltages within a predetermined range, or changes a phase difference between the first and second drive voltages. For example, when the control unit 10 applies the first and second AC voltages having the substantially same voltage value and frequency to the actuator body 4 at the same phase, first-order stretching vibration illustrated in FIG. 6 is induced in the actuator body 4. On the other hand, when the control unit 10 applies the first and second AC voltages having the substantially same voltage value and frequency to the actuator body 4 with the phases of the first and second AC voltages being shifted by 180°, second-order bending vibration illustrated in FIG. 7 is induced in the actuator body 4.

Resonance frequencies of the stretching and bending vibrations in the actuator body 4 are determined depending on, e.g., material and a shape of the actuator body 4. In the present embodiment, the material, shape, etc. of the actuator body 4 are determined so that the resonance frequencies are substantially matched between the first-order stretching vibration and the second-order bending vibration.

When the control unit 10 applies the first and second AC voltages having the substantially same voltage value, and having the substantially same frequency as the resonance frequencies of the first-order stretching vibration and the second-order bending vibration, to the actuator body 4 with the phases of the first and second AC voltages being shifted from each other by 90° or −90°, the first-order stretching vibration and the second-order bending vibration are harmonically induced in the actuator body 4. Consequently, the shape of the actuator body 4 is changed in the order illustrated in FIGS. 8(A)-8(D), and the driver elements 49 attached to the actuator body 4 provide orbit motion, i.e., substantially elliptical motion as viewed in a direction perpendicular to the plan of the page of FIG. 8. That is, the composite vibration of the stretching and bending vibrations of the actuator body 4 allows the substantially elliptical motion of the driver elements 49. Such elliptical motion allows the stage 11 contacting the driver elements 49 to relatively travel with respect to the actuator body 4 in the direction indicated by the arrow A or B in FIG. 1. That is, the actuator body 4 outputs the drive force in the longitudinal direction. The longitudinal direction is equivalent to the drive direction. In order to reduce or prevent abnormal heat generation in the actuator body 4, AC voltage may be applied, which has a frequency slightly higher than a common resonance frequency for the longitudinal and bending vibrations of the actuator body 4.

Travel distance, travel speed, and acceleration of the stage 11 can be adjusted, e.g., by adjusting at least one of the voltage value, the frequency, and the feeding time of the AC voltage to be applied, or by changing the phase difference of the AC voltages to be applied.

A direction of the stretching vibration is the longitudinal direction of the principal surface of the actuator body 4, i.e., a traveling direction of the stage 11, and a direction of the bending vibration is a direction in which the driver elements 49 are pressed against the stage 11. The stacking direction is a direction perpendicular to both of the directions of the stretching and bending vibrations.

As described above, in the ultrasonic actuator 2, the orbit motion of the driver elements 49 is provided in the plan containing the direction of the longitudinal vibration (longitudinal direction) and the direction of the bending vibration (lateral direction). Subsequently, friction force between each of the driver elements 49 and the stage 11 is repeatedly increased/decreased, thereby driving the stage 11.

In the present embodiment, the first to third external electrodes 81-83 serving as the power feeding electrodes are arranged on the principal surface 4A of the actuator body 4. Thus, power can be fed to the first to third external electrodes 81-83 with the single flexible printed board 9. Consequently, wiring can be simplified, and assembly can be improved.

In order to realize the conduction between each of the first to third external electrodes 81-83 and each of the internal electrode layers 5 and 6 in the configuration in which the first to third external electrodes 81-83 are arranged on the principal surface 4A of the actuator body 4, the side electrodes 71A-73B are formed on the side surfaces of the actuator body 4, and the first to third external electrodes 81-83 are connected to the corresponding internal electrode layers 5 and 6 through the side electrodes. In such a configuration, the first to third external electrodes 81-83 formed on the principal surface 4A of the actuator body 4, and the side electrodes 71A-73B formed on the side surfaces of the actuator body 4 are connected together at the edges 40c-40f defined by the principal surface 4A and the side surfaces 4C-4F. Such edges are easily chipped off due to, e.g., an impact from outside. In particular, if the piezoelectric layer 41 is made of ceramic material, the edges are more easily chipped off because the ceramic material is fragile. If the connecting part between the external and side electrodes is damaged due to the damage at the edge, the external and side electrodes are disconnected from each other. Even if the connecting part between the external and side electrodes are partially damaged, resistance to conduction between the external and side electrodes is increased. Further, a coefficient of thermal expansion of, e.g., metal of the external and side electrodes (several tens of ppm/C.°) is several times higher than a coefficient of thermal expansion of, e.g., ceramic material of the piezoelectric layer 41 (several ppm/C.°), and therefore large thermal stress is caused between the piezoelectric layer 41 and each of the external and side electrodes. Such thermal stress is concentrated at the edges. That is, there is a possibility that the damage of the edges is caused due to the thermal stress. In the configuration in which the external and side electrodes are connected together at the edge, reliability of the ultrasonic actuator 2 is degraded.

On the other hand, in the present embodiment, the external electrode and the internal electrode layers which are at the same potential are connected together though the two side electrodes. Specifically, the first external electrode 81 and the first divided electrodes 51A and 51C which are at the same potential are connected together through the two first side electrodes 71A and 71C. The first side electrode 71A is connected to the first external electrode 81 at the long-side edge 40c of the actuator body 4, and the first side electrode 71C is connected to the first external electrode 81 at the short-side edge 40e of the actuator body 4. In such a manner, even if either one of the connecting parts between the first external electrode 81 and the first side electrode 71A, and between the first external electrode 81 and the first side electrode 71C is chipped off due to the damage at the long-side edge 40c or the short-side edge 40e, the connection in the remaining connecting part is maintained. Thus, the conduction between the first external electrode 81 and each of the first divided electrodes 51A and 51C can be maintained.

The second external electrode 82 and the second divided electrodes 52B and 52D which are at the same potential are connected together through the two second side electrodes 72A and 72C. The second external electrode 82 is also connected to the second side electrodes 72A and 72C at the two edges which are the long-side edge 40c and the short-side edge 40f of the actuator body 4. In such a manner, even if either one of the connecting parts between the second external electrode 82 and the second side electrode 72A, and between the second external electrode 82 and the second side electrode 72C is chipped off due to the damage at the long-side edge 40c or the short-side edge 40f, the connection in the remaining connecting part is maintained. Thus, the conduction between the second external electrode 82 and each of the second divided electrodes 52B and 52D can be maintained.

The third external electrode 83 and the minus electrode layers 6 which are at the same potential are connected together through the two third side electrodes 73A and 73B. The third external electrode 83 is also connected to the third side electrodes 73A and 73B at the two edges which are the long-side edges 40c and 40d of the actuator body 4. In such a manner, even if either one of the connecting parts between the third external electrode 83 and the third side electrode 73A, and between the third external electrode 83 and the third side electrode 73B is chipped off due to the damage at the long-side edge 40c or 40d, the connection in the remaining connecting part is maintained. Thus, the conduction between the third external electrode 83 and each of the minus electrode layers 6 can be maintained. The length of the connecting part between the third external electrode 83 and each of the third side electrodes 73A and 73B along the edge (hereinafter simply referred to as the "length of the connecting part") is longer than the length of the connecting part between the first external electrode 81 and each of the first side electrodes 71A and 71C, and the length of the connecting part between the second external electrode 82 and each of the second side electrodes 72A and 72C.

Consequently, according to the present embodiment, a plurality of side electrodes 71A-73B connected to the external electrodes 81-83 at the edges 40c-40f of the actuator body 4 are provided for each of the external electrodes 81-83. Thus, even if one of the connecting parts between each of the external electrodes 81-83 and each of the side electrodes 71A-73B is damaged, the conduction in the remaining connecting parts are maintained. Consequently, the reliability of the ultrasonic actuator 2 can be improved.

The first side electrodes 71A and 71C provided for the first external electrode 81 are connected to the first external electrode 81 at the different edges which are the long-side edge 40c and the short-side edge 40e. Thus, even if one of the edges is damaged, the connection in the connecting part between either one of the first side electrodes 71A and 71C and the first external electrode 81 is maintained. Consequently, the conduction between the first external electrode 81 and each of the first divided electrodes 51A and 51C can be maintained. That is, when connecting the first external electrode 81 and the first side electrodes 71A and 71C together at the same edge, if the edge is damaged across a wide area, there is a possibility that the connection sections between the first external electrode 81 and each of the first side electrodes 71A and 71C are also damaged. On the other hand, the connecting parts between the first external electrode 81 and each of the first side electrodes 71A and 71C are provided at the different edges, thereby diversifying risks of the damage of the connecting parts. Consequently, the reliability of the ultrasonic actuator 2 can be improved.

Similarly, the second side electrodes 72A and 72C provided for the second external electrode 82 are connected to the second external electrode 82 at the different edges which are the long-side edge 40c and the short-side edge 40f. Thus, even if one of the connecting parts is damaged, the connection in the connecting part between either one of the second side electrodes 72A and 72C and the second external electrode 82 is maintained. Consequently, the conduction between the second external electrode 82 and each of the second divided electrodes 52B and 52D can be maintained.

Further, the third side electrodes 73A and 73B provided for the third external electrode 83 are connected to the third external electrode 83 at the different edges which are the long-side edge 40c and the long-side edge 40d. Thus, even if one of the connecting parts are damaged, the connection in the connecting part between either one of the third side electrodes 73A and 73B and the third external electrode 83 is maintained. Consequently, the conduction between the third external electrode 83 and each of the minus electrode layers 6 can be maintained.

The first external electrode 81 is connected to the first side electrodes 71A and 71C at the long-side edge 40c and the short-side edge 40e, i.e., the two edges which are not parallel to each other, thereby further improving the reliability of the ultrasonic actuator 2. That is, when conveying the actuator body 4 by a machine etc. during a manufacturing process etc., the actuator body 4 is sandwiched from both sides by, e.g., chucks. When sandwiching the actuator body 4 by such holding members, there is a possibility that the edges contacting the holding members are damaged. Since it is highly likely that the parallel edges of the actuator body 4 are sandwiched together by the holding members, there is a possibility that the parallel edges are simultaneously damaged. In addition, when conveying the actuator body 4 in, e.g., the manufacturing process, the actuator body 4 is often sandwiched by the holding members, or is mounted on, e.g., a conveyance table in order to be conveyed with a certain attitude being maintained. That is, all of the parallel edges are in the same attitude with respect to a traveling direction, and therefore a risk of contacting external obstacles is equal at all of the parallel edges. Thus, in such a case, there is a possibility that the parallel edges are simultaneously damaged. Further, when printing the external electrodes etc. on the piezoelectric layer 41, e.g., masking is applied to the piezoelectric layer 41, and then molten material which will be the external electrodes is applied to the piezoelectric layer 41 in a certain direction. Thus, the molten material is applied in the similar states (e.g., thickness) at the parallel edges. For example, when the molten material is applied to the principal surface 41a of the piezoelectric layer 41 in the longitudinal direction, it is highly likely that the molten material is applied in the similar states at a pair of the long-side edges 40c and 40d. However, it is highly likely that the application states at the long-side edge 40c (40d) and the short-side edge 40e (40f) are different from each other because directions in which the edges extend relative to the application direction are different. Thus, in some cases, there is a possibility that all of the connecting parts equally become thinner, i.e., are easily and entirely damaged. On the other hand, the connecting parts between the first external electrode 81 and each of the first side electrodes 71A and 71C are provided at the two edges which are not parallel to each other (i.e., the long-side edge 40c and the short-side edge 40e), thereby reducing or preventing the simultaneous damage of all of the connecting parts, and the formation of the entirely-thin connecting parts.

Similarly, the connecting parts between the second external electrode 82 and each of the second side electrodes 72A and 72C are provided at the long-side edge 40c and the short-side edge 40f, i.e., the two edges which are not parallel to each other, thereby reducing or preventing the simultaneous damage of all of the connecting parts, and the formation of the entirely-thin connecting parts.

Further, on the principal surface 4A of the actuator body 4, the first to third external electrodes 81-83 are arranged so as to be symmetrical about the line which contains the center of gravity of the principal surface 4A, and which extends in the lateral direction, thereby ensuring symmetric vibration of the actuator body 4. This stabilizes the drive force outputted from the ultrasonic actuator 2, and allows the drive force to be uniformly outputted to both sides of the ultrasonic actuator 2 in the drive direction.

The connecting part between each of the first to third external electrodes 81-83 and the flexible printed board 9 is arranged near the node of the bending vibration, and therefore hindrance to the vibration of the actuator body 4 by the connecting part between each of the first to third external electrodes 81-83 and the flexible printed board 9 can be reduced. Further, the connecting part between the third external electrode 83 and the flexible printed board 9 is arranged near the nodes of the bending and stretching vibrations, thereby further reducing the hindrance to the vibration of the actuator body 4.

The length of the connecting part between the third external electrode 83 and each of the third side electrodes 73A and 73B is longer than the length of the connecting part between the first external electrode 81 and each of the first side electrodes 71A and 71C, and the length of the connecting part between the second external electrode 82 and each of the second side electrodes 72A and 72C, thereby reducing a power loss. That is, in the present embodiment, the minus electrode layer 6 is shared as the opposite electrode for the first divided electrodes 51A and 51C and the second divided electrodes 52B and 52D. Current higher than current flowing through the first divided electrodes 51A and 51C and the second divided electrodes 52B and 52D flows through the minus electrode layer 6. Thus, the length of the connecting part between the third external electrode 83 and each of the third side electrodes 73A and 73B, through which higher current flows is increased to reduce the resistance to conduction, thereby reducing the power loss.

The principal surface 4A of the actuator body 4 is parallel to the longitudinal direction which is the drive direction in which the drive force is outputted, and the first to third external electrodes 81-83 are provided on the principal surface 4A. Thus, the flexible printed board 9 connected to the first to third external electrodes 81-83 can be provided so as to extend along the drive direction. As described above, the flexible printed board 9 connected to the first to third external electrodes 81-83 is provided so as to extend from the first to third external electrodes 81-83 along the longitudinal direction which is the output direction of the drive force, thereby simplifying arrangement of the flexible printed board 9. That is, in the present embodiment, the stage 11 travels in the drive direction. Thus, if the flexible printed board 9 extends from the actuator body 4 in the lateral direction or the thickness direction perpendicular to the drive direction, there is a possibility that the flexible printed board 9 interferes with the stage 11 and objects traveling together with the stage 11. On the other hand, if the flexible printed board 9 is provided so as to extend along the drive direction, the interference with the stage 11 and the objects traveling together with the stage 11 by the flexible printed board 9 can be reduced or prevented. In a configuration in which a stage 11 is fixed, and an object to which an ultrasonic actuator 2 is attached travels relative to the stage 11 (i.e., self-propelled type configuration), a space in which the ultrasonic actuator 2 travels is ensured in a drive direction. When the flexible printed board 9 is provided so as to extend in the drive direction, such a space can be used for the extension of the flexible printed board 9. Consequently, interference with fixed bodies such as the stage 11 by the flexible printed board 9 can be reduced or prevented.

<First Variation>

Next, a first variation of the present embodiment will be described. An ultrasonic actuator of the first variation has a configuration of internal electrodes 105 and 106 of an actuator body 104, which is different from the configuration of the internal electrode layers 5 and 6 of the actuator body 4.

Figure 9:
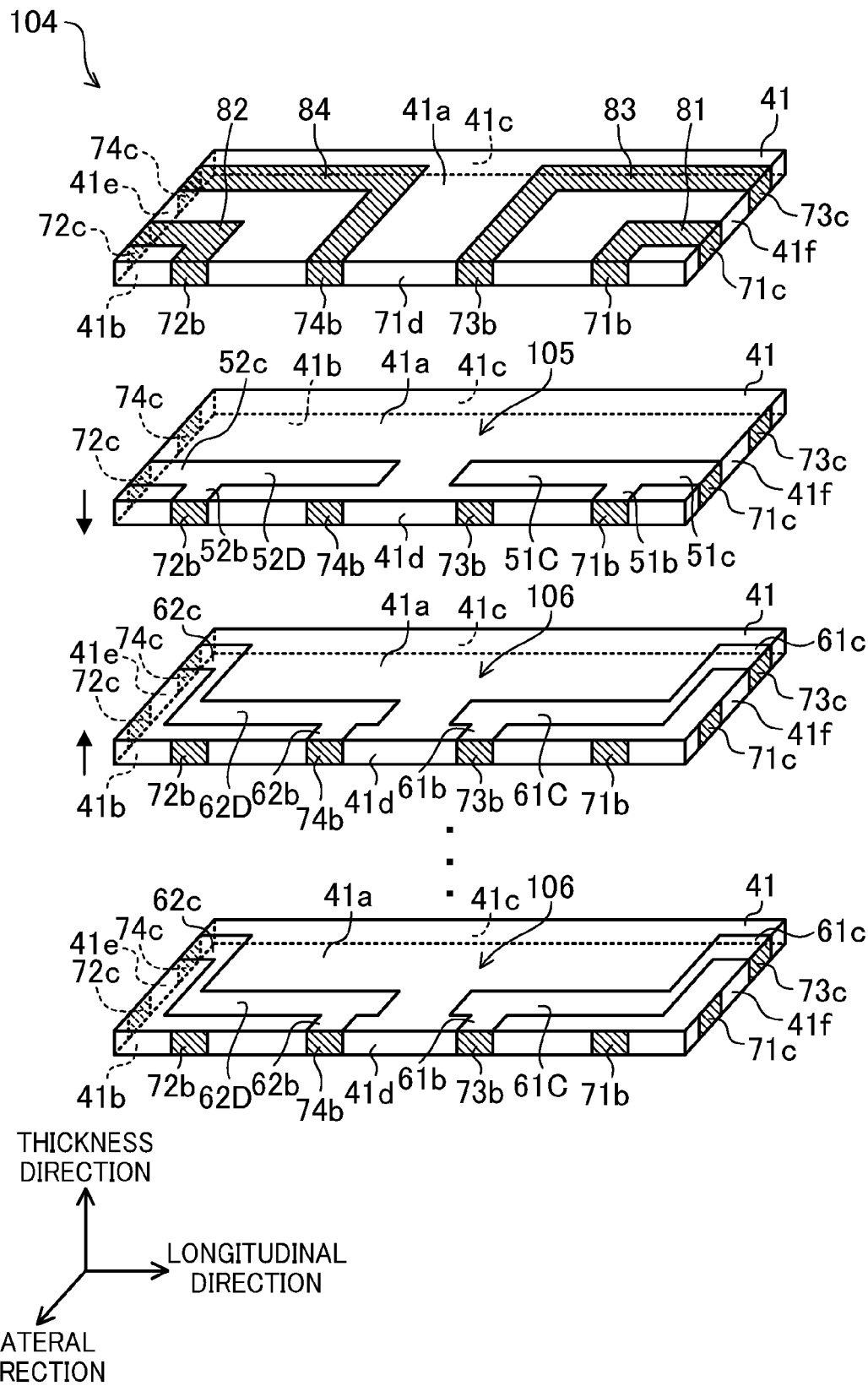
FIG. 9 is an exploded perspective view of an actuator body of a first variation.

As illustrated in FIG. 9, in the actuator body 104, electrodes are provided only in areas A3 and A4 (see FIG. 4) of a principal surface 41a of a piezoelectric layer 41. That is, the principal surface 41a of the piezoelectric layer 41 is divided into four areas A1-A4, i.e., two areas in a longitudinal direction L and two areas in a lateral direction S. The plus electrode layer 105 of the actuator body 104 includes a first divided electrode 51C provided in the area A3 of the four areas A1-A4; and a second divided electrode 52D provided in the area A4 adjacent to the area A3 in the longitudinal direction. The minus electrode layer 106 of the actuator body 104 is not a common electrode for the first and second divided electrodes 51C and 52D; and includes a first divided opposite electrode 61C facing the first divided electrode 51C with the piezoelectric layer 41 being interposed therebetween, and a second divided opposite electrode 62D facing the second divided electrode 52D with the piezoelectric layer 41 being interposed therebetween. The plus electrode layer 105 and the minus electrode layer 106 serve as internal electrodes. The first divided electrode 51C serves as a first electrode, and the second divided electrode 52D serves as a second electrode arranged in a pattern different from that of the first divided electrode 51C. The first divided opposite electrode 61C serves as a first opposite electrode, and the second divided opposite electrode 62D serves as a second opposite electrode.

On a long-side surface 41d of the piezoelectric layer 41, a second side electrode 72b is provided in one of end sections of the long-side surface 41d in the longitudinal direction; a first side electrode 71b is provided in the other end section in the longitudinal direction; a fourth side electrode 74b is provided between the second side electrode 72b and the center of the long-side surface 41d in the longitudinal direction; and a third side electrode 73b is provided between the first side electrode 71b and the center of the long-side surface 41d in the longitudinal direction. On a short-side surface 41e of the piezoelectric layer 41, a fourth side electrode 74c is provided in one of end sections of the short-side surface 41e in the lateral direction, and a second side electrode 72c is provided in the other end section in the lateral direction. On a short-side surface 41f of the piezoelectric layer 41, a third side electrode 73c is formed in one of end sections of the short-side surface 41f in the lateral direction, and a first side electrode 71c is provided in the other end section in the lateral direction.

The first divided electrode 51C includes a lead electrode 51b extending to the first side electrode 71b of the long-side surface 41d, and a lead electrode 51c extending to the first side electrode 71c of the short-side surface 41f. That is, the first divided electrode 51C is connected to the first side electrode 71b through the lead electrode 51b, and is connected to the first side electrode 71c through the lead electrode 51c. In addition, the second divided electrode 52D includes a lead electrode 52b extending to the second side electrode 72b of the long-side surface 41d, and a lead electrode 52c extending to the second side electrode 72c of the short-side surface 41e. That is, the second divided electrode 52D is connected to the second side electrode 72b through the lead electrode 52b, and is connected to the second side electrode 72c through the lead electrode 52c. Further, the first divided opposite electrode 61C includes a lead electrode 61b extending to the third side electrode 73b of the long-side surface 41d, and a lead electrode 61c extending to the third side electrode 73c of the short-side surface 41f. That is, the first divided opposite electrode 61C is connected to the third side electrode 73b through the lead electrode 61b, and is connected to the third side electrode 73c through the lead electrode 61c. The second divided opposite electrode 62D includes a lead electrode 62*b* extending to the fourth side electrode 74*b* of the long-side surface 41*d*, and a lead electrode 62*c* extending to the fourth side electrode 74*c* of the short-side surface 41*e*. That is, the second divided opposite electrode 62D is connected to the fourth side electrode 74*b* through the lead electrode 62*b*, and is connected to the fourth side electrode 74*c* through the lead electrode 62*c*.

Figure 10:
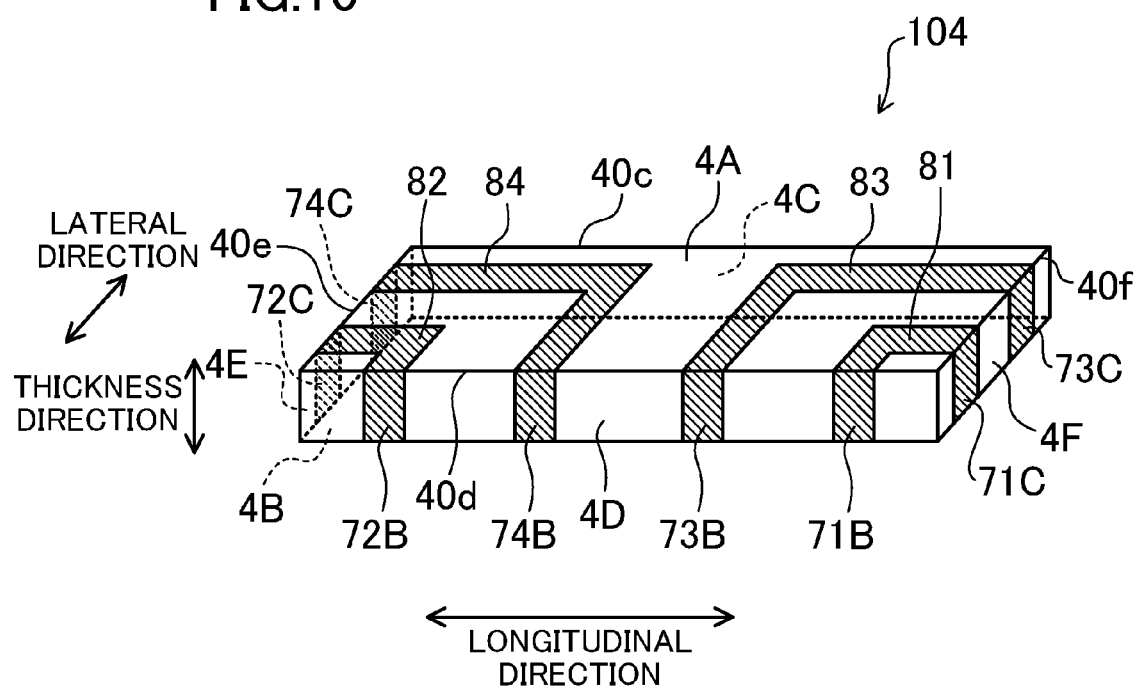
FIG. 10 is a perspective view of the actuator body of the first variation.

When stacking the piezoelectric layers 41 configured as described above, the first to fourth side electrodes 71*b*-74*c* formed on the side surfaces of the piezoelectric layers 41 are connected together in the stacking direction, and the integrally-connected first to fourth side electrodes 71B-74C are formed on the side surfaces of the body of the piezoelectric layers 41, i.e., the actuator body 104. Specifically, as illustrated in FIG. 10, on a long-side surface 4D of the actuator body 104, the followings are formed: a second side electrode 72B formed by connecting a plurality of second side electrodes 72*b* as a single group; a fourth side electrode 74B formed by connecting a plurality of fourth side electrodes 74*b* as a single group; a third side electrode 73B formed by connecting a plurality of third side electrodes 73*b* as a single group; and a first side electrode 71B formed by connecting a plurality of first side electrodes 71*b* as a single group. On a short-side surface 4E of the actuator body 104, the followings are formed: a fourth side electrode 74C formed by connecting a plurality of fourth side electrodes 74*c* as a single group; and a second side electrode 72C formed by connecting a plurality of second side electrodes 72*c* as a single group. On a short-side surface 4F of the actuator body 104, the followings are formed: a third side electrode 73C formed by connecting a plurality of third side electrodes 73*c* as a single group; and a first side electrode 71C formed by connecting a plurality of first side electrodes 71*c* as a single group.

The followings are formed on the principal surface 41*a* exposed to an outside of the outermost piezoelectric layer 41 of the actuator body 104 (i.e., the principal surface 4A of the actuator body 104): a first external electrode 81 through which power is fed to the first divided electrode 51C; a second external electrode 82 through which power is fed to the second divided electrode 52D; a third external electrode 83 through which power is fed to the first divided opposite electrode 61C; and a fourth external electrode 84 through which power is fed to the second divided opposite electrode 62D. The first to fourth external electrodes 81-84 are arranged so as to be symmetrical about a line passing through the center of gravity of the principal surface 4A of the actuator body 104, and extending in the lateral direction.

The first external electrode 81 is formed in L-shape in one of corner sections of the principal surface 4A of the actuator body 104. One end of the first external electrode 81 is connected to the first side electrode 71B of the long-side surface 4D, and the other end is connected to the first side electrode 71C of the short-side surface 4F. Specifically, the first external electrode 81 and the first side electrode 71B are connected together at a long-side edge 40*d* defined by the principal surface 4A and the long-side surface 4D of the actuator body 104. In addition, the first external electrode 81 and the first side electrode 71C are connected together at a short-side edge 40*f* defined by the principal surface 4A and the short-side surface 4F of the actuator body 104. The first external electrode 81 and the first side electrodes 71B and 71C connected together as described above are formed so as to cross the two edges 40*d* and 40*f*. Thus, the first external electrode 81 is in conduction with the first divided electrodes 51C through the two first side electrodes 71B and 71C.

The second external electrode 82 is formed in L-shape in a corner section of the actuator body 104 other than the corner section where the first external electrode 81 is positioned (corner section on an opposite side in the longitudinal direction). One end of the second external electrode 82 is connected to the second side electrode 72B of the long-side surface 4D, and the other end is connected to the second side electrode 72C of the short-side surface 4E. Specifically, the second external electrode 82 and the second side electrode 72B are connected together at the long-side edge 40*d* defined by the principal surface 4A and the long-side surface 4D of the actuator body 104. In addition, the second external electrode 82 and the second side electrode 72C are connected together at a short-side edge 40*e* defined by the principal surface 4A and the short-side surface 4E of the actuator body 104. The second external electrode 82 and the second side electrodes 72B and 72C connected together as described above are formed so as to cross the two edges 40*d* and 40*e*. Thus, the second external electrode 82 is in conduction with the second divided electrodes 52D through the two second side electrodes 72B and 72C.

The third external electrode 83 is formed in L-shape so as to surround the first external electrode 81 in the corner section where the first external electrode 81 is provided. One end of the third external electrode 83 is connected to the third side electrode 73B of the long-side surface 4D, and the other end is connected to the third side electrode 73C of the short-side surface 4F. Specifically, the third external electrode 83 and the third side electrode 73B are connected together at the long-side edge 40*d* defined by the principal surface 4A and the long-side surface 4D of the actuator body 104. In addition, the third external electrode 83 and the third side electrode 73C are connected together at the short-side edge 40*f* defined by the principal surface 4A and the short-side surface 4F of the actuator body 104. The third external electrode 83 and the third side electrodes 73B and 73C connected together as described above are formed so as to cross the two edges 40*d* and 40*f*. Thus, the third external electrode 83 is in conduction with the first divided opposite electrodes 61C through the two third side electrodes 73B and 73C.

The fourth external electrode 84 is formed in L-shape so as to surround the second external electrode 82 in the corner section where the second external electrode 82 is provided. One end of the fourth external electrode 84 is connected to the fourth side electrode 74B of the long-side surface 4D, and the other end is connected to the fourth side electrode 74C of the short-side surface 4E. Specifically, the fourth external electrode 84 and the fourth side electrode 74B are connected together at the long-side edge 40*d* defined by the principal surface 4A and the long-side surface 4D of the actuator body 104. In addition, the fourth external electrode 84 and the fourth side electrode 74C are connected together at the short-side edge 40*e* defined by the principal surface 4A and the short-side surface 4E of the actuator body 104. The fourth external electrode 84 and the fourth side electrodes 74B and 74C connected together as described above are formed so as to cross the two edges 40*d* and 40*e*. Thus, the fourth external electrode 84 is in conduction with the second divided opposite electrodes 62D through the two fourth side electrodes 74B and 74C.

In the actuator body 104 configured as described above, the first to fourth external electrodes 81-84 are exposed to outside. Power is fed to the actuator body 104 by using the first to fourth external electrodes 81-84 as power feeding terminals. Specifically, a flexible printed board (not shown in the figure) is connected to the first to fourth external electrodes 81-84 on the principal surface 4A of the actuator body 104. First and second drive voltages, phases of which are shifted by 90°, are applied to the first divided electrode 51C and the first divided opposite electrode 61C, and to the second divided electrode 52D and the second divided opposite electrode 62D, and therefore first-order stretching vibration and second-order bending vibration can be harmonically generated in the actuator body 104. Consequently, orbit motion of driver elements 49 is provided, thereby outputting drive force in the longitudinal direction of the actuator body 104.

In such a configuration, two side electrodes are provided for each external electrode. Thus, even if one of the connecting parts between the external and side electrodes is damaged, conduction in another connecting part is maintained, thereby improving reliability of an ultrasonic actuator 2. For example, the two first side electrodes 71B and 71C are connected to the first external electrode 81 at the edges 40d and 40f. Even if the edge 40d is damaged, and the first external electrode 81 and the first side electrode 71B are disconnected from each other, the first external electrode 81 and the first side electrode 71C are connected. Thus, conduction between the first external electrode 81 and each of the first divided electrodes 51C are maintained.

<Second Variation>

Next, an ultrasonic actuator of a second variation will be described. The ultrasonic actuator of the second variation has a configuration of internal electrodes of an actuator body 204, which is different from the configuration of the internal electrode layers 5 and 6 of the actuator body 4.

Figure 11:
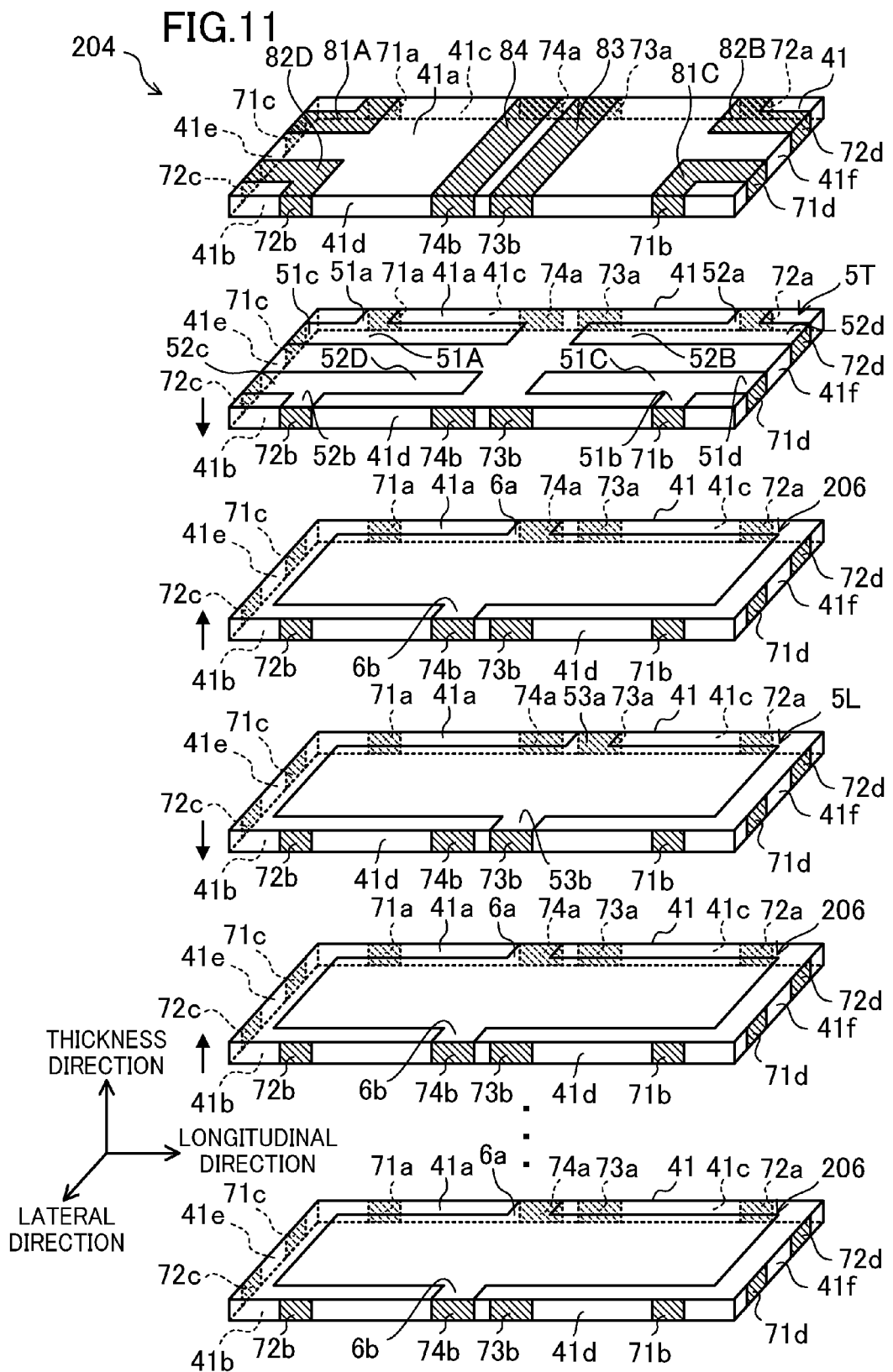
FIG. 11 is an exploded perspective view of an actuator body of a second variation.

As illustrated in FIG. 11, as internal electrode layers, the actuator body 204 includes first plus electrode layers 5T, second plus electrode layers 5L, and minus electrode layers 206. The first plus electrode layer 5T includes four first to second divided electrodes 51A, 52B, 51C, and 52D. The second plus electrode layer 5L is a single electrode formed across a substantially entire area of a principal surface 41a of a piezoelectric layer 41. As in the second plus electrode layer 5L, the minus electrode layer 206 is also a single electrode formed across a substantially entire area of the principal surface 41a of the piezoelectric layer 41. The first plus electrode layer 5T, the second plus electrode layer 5L, and the minus electrode layer 206 serve as internal electrodes. The first divided electrodes 51A and 51C serve as first electrodes, and the second divided electrodes 52B and 52D serve as second electrodes arranged in a pattern different from that of the first divided electrodes 51A and 51C. The second plus electrode layer 5L also serves as a second electrode arranged in a pattern different from that of the first divided electrodes 51A and 51C. The minus electrode layer 206 serves as a first opposite electrode facing the first divided electrodes 51A and 51C with the piezoelectric layer 41 being interposed therebetween, and also serves as a second opposite electrode facing the second divided electrodes 52B and 52D with the piezoelectric layer 41 being interposed therebetween. Further, the minus electrode layer 206 also serves as a second opposite electrode facing the second plus electrode layer 5L with the piezoelectric layer 41 being interposed therebetween.

The actuator body 204 is formed by stacking a plurality of piezoelectric layers 41 in the following order: the piezoelectric layer 41 on which the first plus electrode layer 5T is provided; the piezoelectric layer 41 on which the minus electrode layer 206 is provided; the piezoelectric layer 41 on which the second plus electrode layer 5L is provided; and the piezoelectric layer 41 on which the minus electrode layer 206 is provided.

On a long-side surface 41c of the piezoelectric layer 41, a first side electrode 71a is provided in one of end sections of the long-side surface 41c in the longitudinal direction; a second side electrode 72a is provided in the other end section in the longitudinal direction; a fourth side electrode 74a is provided between the first side electrode 71a and the center of the long-side surface 41c in the longitudinal direction; and a third side electrode 73a is provided between the second side electrode 72a and the center of the long-side surface 41c in the longitudinal direction. On a long-side surface 41d of the piezoelectric layer 41, a second side electrode 72b is provided in one of end sections of the long-side surface 41d in the longitudinal direction; a first side electrode 71b is provided in the other end section in the longitudinal direction; a fourth side electrode 74b is provided between the second side electrode 72b and the center of the long-side surface 41d in the longitudinal direction; and a third side electrode 73b is provided between the first side electrode 71b and the center of the long-side surface 41d in the longitudinal direction. On a short-side surface 41e of the piezoelectric layer 41, a first side electrode 71c is provided in one of end sections of the short-side surface 41e in the lateral direction, and a second side electrode 72c is provided in the other end section in the lateral direction. On a short-side surface 41f of the piezoelectric layer 41, a second side electrode 72d is provided in one of end sections of the short-side surface 41f in the lateral direction, and a first side electrode 71d is provided in the other end section in the lateral direction.

The first divided electrode 51A includes a lead electrode 51a extending to the first side electrode 71a of the long-side surface 41c, and a lead electrode 51c extending to the first side electrode 71c of the short-side surface 41e. That is, the first divided electrode 51A is connected to the first side electrode 71a through the lead electrode 51a, and is connected to the first side electrode 71c through the lead electrode 51c. In addition, the first divided electrode 51C includes a lead electrode 51b extending to the first side electrode 71b of the long-side surface 41d, and a lead electrode 51d extending to the first side electrode 71d of the short-side surface 41f. That is, the first divided electrode 51C is connected to the first side electrode 71b through the lead electrode 51b, and is connected to the first side electrode 71d through the lead electrode 51d.

The second divided electrode 52B includes a lead electrode 52a extending to the second side electrode 72a of the long-side surface 41c, and a lead electrode 52d extending to the second side electrode 72d of the short-side surface 41f. That is, the second divided electrode 52B is connected to the second side electrode 72a through the lead electrode 52a, and is connected to the second side electrode 72d through the lead electrode 52d. The second divided electrode 52D includes a lead electrode 52b extending to the second side electrode 72b of the long-side surface 41d, and a lead electrode 52c extending to the second side electrode 72c of the short-side surface 41e. That is, the second divided electrode 52D is connected to the second side electrode 72b through the lead electrode 52b, and is connected to the second side electrode 72c through the lead electrode 52c.

The second plus electrode layer 5L includes a lead electrode 53a extending to the third side electrode 73a of the long-side surface 41c, and a lead electrode 53b extending to the third side electrode 73b of the long-side surface 41d. That is, the second plus electrode layer 5L is connected to the third side electrode 73a through the lead electrode 53a, and is connected to the third side electrode 73b through the lead electrode 53b.

The minus electrode layer 206 includes a lead electrode 6a extending to the fourth side electrode 74a of the long-side surface 41c, and a lead electrode 6b extending to the fourth side electrode 74b of the long-side surface 41d. That is, the minus electrode layer 206 is connected to the fourth side electrode 74a through the lead electrode 6a, and is connected to the fourth side electrode 74b through the lead electrode 6b.

Figure 12:
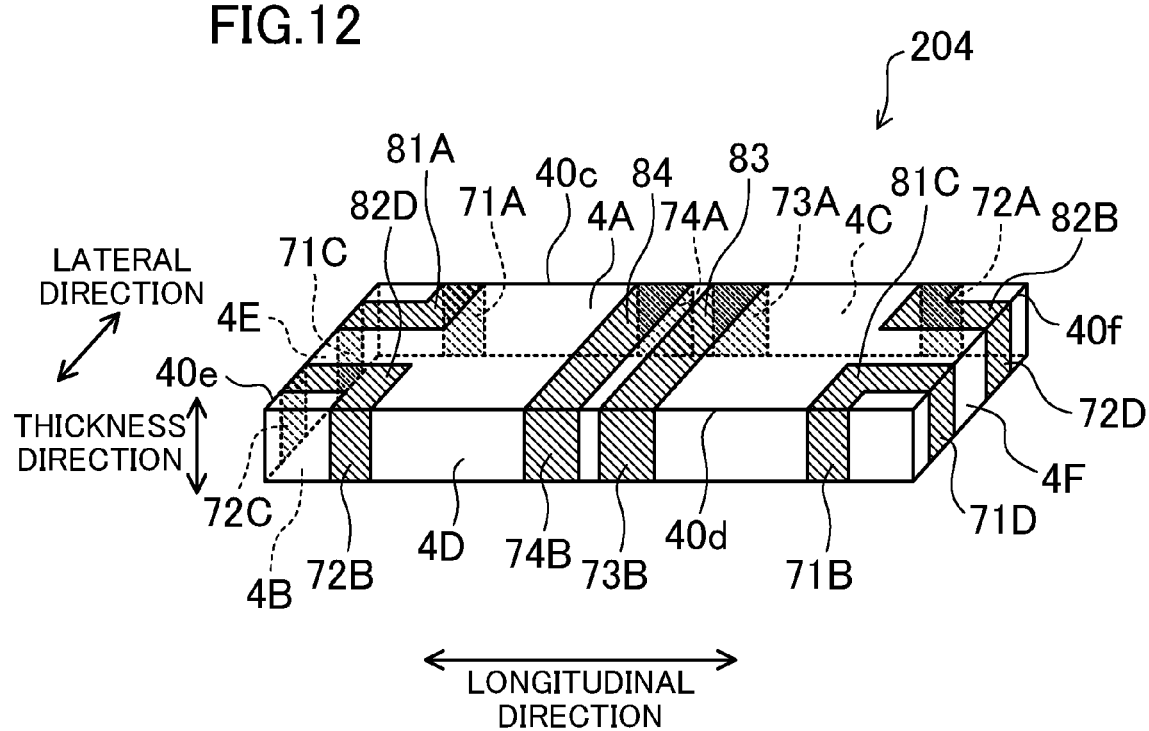
FIG. 12 is a perspective view of the actuator body of the second variation.

When stacking the piezoelectric layers 41 configured as described above, the first to fourth side electrodes 71a-74b formed on the side surfaces of the piezoelectric layers 41 are connected together in the stacking direction, and the integrally-connected first to fourth side electrodes 71A-74B are formed on the side surfaces of the body of the piezoelectric layers 41, i.e., the actuator body 204. Specifically, as illustrated in FIG. 12, on a long-side surface 4C of the actuator body 204, the followings are formed: a first side electrode 71A formed by connecting a plurality of first side electrodes 71a as a single group; a fourth side electrode 74A formed by connecting a plurality of fourth side electrodes 74a as a single group; a third side electrode 73A formed by connecting a plurality of third side electrodes 73a as a single group; and a second side electrode 72A formed by connecting a plurality of second side electrodes 72a as a single group. On a long-side surface 4D of the actuator body 204, the followings are formed: a second side electrode 72B formed by connecting a plurality of second side electrodes 72b as a single group; a fourth side electrode 74B formed by connecting a plurality of fourth side electrodes 74b as a single group; a third side electrode 73B formed by connecting a plurality of third side electrodes 73b as a single group; and a first side electrode 71B formed by connecting a plurality of first side electrodes 71b as a single group. On a short-side surface 4E of the actuator body 204, the followings are formed: a first side electrode 71C formed by connecting a plurality of first side electrodes 71c as a single group; and a second side electrode 72C formed by connecting a plurality of second side electrodes 72c as a single group. On a short-side surface 4F of the actuator body 204, the followings are formed: a second side electrode 72D formed by connecting a plurality of second side electrodes 72d as a single group; and a first side electrode 71D formed by connecting a plurality of first side electrodes 71d as a single group.

The followings are formed on the principal surface 41a exposed to an outside of the outermost piezoelectric layer 41 of the actuator body 204 (i.e., the principal surface 4A of the actuator body 204): a first external electrode 81A through which power is fed to the first divided electrodes 51A; a first external electrode 81C through which power is fed to the first divided electrodes 51C; a second external electrode 82B through which power is fed to the second divided electrodes 52B; a second external electrode 82D through which power is fed to the second divided electrodes 52D; a third external electrode 83 through which power is fed to the second plus electrode layers 5L; and a fourth external electrode 84 through which power is fed to the minus electrode layers 206. The first to fourth external electrodes 81A-84 are arranged so as to be symmetrical about a line passing through the center of gravity of the principal surface 4A of the actuator body 204, and extending in the lateral direction.

The first external electrode 81A is formed in L-shape so as to surround a corner section of the principal surface 4A in an area A1 (see FIG. 4) of four areas which are formed by dividing the principal surface 4A of the actuator body 204 into two areas in the longitudinal and lateral directions. One end of the first external electrode 81A is connected to the first side electrode 71A of the long-side surface 4C, and the other end is connected to the first side electrode 71C of the short-side surface 4E. Specifically, the first external electrode 81A and the first side electrode 71A are connected together at a long-side edge 40c defined by the principal surface 4A and the long-side surface 4C of the actuator body 204. In addition, the first external electrode 81A and the first side electrode 71C are connected together at a short-side edge 40e defined by the principal surface 4A and the short-side surface 4E of the actuator body 204. The first external electrode 81A and the first side electrodes 71A and 71C connected together as described above are formed so as to cross the two edges 40c and 40e. Thus, the first external electrode 81A is in conduction with the first divided electrodes 51A through the two first side electrodes 71A and 71C.

The first external electrode 81C is formed in L-shape so as to surround a corner section of the principal surface 4A in an area A3 (see FIG. 4) of the four areas which are formed by dividing the principal surface 4A of the actuator body 204 into two areas in the longitudinal and lateral directions. One end of the first external electrode 81C is connected to the first side electrode 71B of the long-side surface 4D, and the other end is connected to the first side electrode 71D of the short-side surface 4F. Specifically, the first external electrode 81C and the first side electrode 71B are connected together at a long-side edge 40d defined by the principal surface 4A and the long-side surface 4D of the actuator body 204. In addition, the first external electrode 81C and the first side electrode 71D are connected together at a short-side edge 40f defined by the principal surface 4A and the short-side surface 4F of the actuator body 204. The first external electrode 81C and the first side electrodes 71B and 71D connected together as described above are formed so as to cross the two edges 40d and 40f. Thus, the first external electrode 81C is in conduction with the first divided electrodes 51C through the two first side electrodes 71B and 71D.

The second external electrode 82B is formed in L-shape so as to surround a corner section of the principal surface 4A in an area A2 (see FIG. 4) of the four areas which are formed by dividing the principal surface 4A of the actuator body 204 into two areas in the longitudinal and lateral directions. One end of the second external electrode 82B is connected to the second side electrode 72A of the long-side surface 4C, and the other end is connected to the second side electrode 72D of the short-side surface 4F. Specifically, the second external electrode 82B and the second side electrode 72A are connected together at the long-side edge 40c defined by the principal surface 4A and the long-side surface 4C of the actuator body 204. In addition, the second external electrode 82B and the second side electrode 72D are connected together at the short-side edge 40f defined by the principal surface 4A and the short-side surface 4F of the actuator body 204. The second external electrode 82B and the second side electrodes 72A and 72D connected together as described above are formed so as to cross the two edges 40c and 40f. Thus, the second external electrode 82B is in conduction with the second divided electrodes 52B through the two second side electrodes 72A and 72D.

The second external electrode 82D is formed in L-shape so as to surround a corner section of the principal surface 4A in an area A4 (see FIG. 4) of the four areas which are formed by dividing the principal surface 4A of the actuator body 204 into two areas in the longitudinal and lateral directions. One end of the second external electrode 82D is connected to the second side electrode 72B of the long-side surface 4D, and the other end is connected to the second side electrode 72C of the short-side surface 4E. Specifically, the second external electrode 82D and the second side electrode 72B are connected together at the long-side edge 40d defined by the principal surface 4A and the long-side surface 4D of the actuator body 204. In addition, the second external electrode 82D and the second side electrode 72C are connected together at the short-side edge 40e defined by the principal surface 4A and the short-side surface 4E of the actuator body 204. The second external electrode 82D and the second side electrodes 72B and 72C connected together as described above are formed so as to cross the two edges 40d and 40e. Thus, the second external electrode 82D is in conduction with the second divided electrodes 52D through the two second side electrodes 72B and 72C.

The third external electrode 83 is linearly formed so as to laterally extend in a section of the areas A2 and A3 near the center of the principal surface 4A of the actuator body 204 in the longitudinal section. One end of the third external electrode 83 is connected to the third side electrode 73A of the long-side surface 4C, and the other end is connected to the third side electrode 73B of the long-side surface 4D. Specifically, the third external electrode 83 and the third side electrode 73A are connected together at the long-side edge 40c defined by the principal surface 4A and the long-side surface 4C of the actuator body 204. In addition, the third external electrode 83 and the third side electrode 73B are connected together at the long-side edge 40d defined by the principal surface 4A and the long-side surface 4D of the actuator body 204. The third external electrode 83 and the third side electrodes 73A and 73B connected together as described above are formed so as to cross the two edges 40c and 40d. Thus, the third external electrode 83 is in conduction with the second plus electrode layers 5L through the two third side electrodes 73A and 73B.

The fourth external electrode 84 is linearly formed so as to laterally extend in a section of the areas A1 and A4 near the center of the principal surface 4A of the actuator body 204 in the longitudinal section. One end of the fourth external electrode 84 is connected to the fourth side electrode 74A of the long-side surface 4C, and the other end is connected to the fourth side electrode 74B of the long-side surface 4D. Specifically, the fourth external electrode 84 and the fourth side electrode 74A are connected together at the long-side edge 40c defined by the principal surface 4A and the long-side surface 4C of the actuator body 204. In addition, the fourth external electrode 84 and the fourth side electrode 74B are connected together at the long-side edge 40d defined by the principal surface 4A and the long-side surface 4D of the actuator body 204. The fourth external electrode 84 and the fourth side electrodes 74A and 74B connected together as described above are formed so as to cross the two edges 40c and 40d. Thus, the fourth external electrode 84 is in conduction with the minus electrode layers 206 through the fourth side electrodes 74A and 74B.

In the actuator body 204 configured as described above, the first to fourth external electrodes 81A-84 are exposed to outside. Power is fed to the actuator body 204 by using the first to fourth external electrodes 81A-84 as power feeding terminals. Specifically, a flexible printed board (not shown in the figure) is connected to the first to fourth external electrodes 81A-84 on the principal surface 4A of the actuator body 204. First drive voltage is applied to the first divided electrodes 51A and 51C and the minus electrode layers 206 through the first external electrodes 81A and 81C and the fourth external electrode 84, and second drive voltage is applied to the second divided electrodes 52B and 52D and the minus electrode layers 206 through the second external electrodes 82B and 82D and the fourth external electrode 84 with its phase being shifted from a phase of the first drive voltage by 180°. As a result, bending vibration is generated in the piezoelectric layer 41 sandwiched between the first plus electrode layer 5T and the minus electrode layer 206. In addition to the above, third drive voltage is applied to the second plus electrode layers 5L and the minus electrode layers 206 through the third external electrode 83 and the fourth external electrode 84 with its phase being shifted from each of the phases of the first and second drive voltages by 90°. This results in generation of stretching vibration in the piezoelectric layer 41 sandwiched between the second plus electrode layer 5L and the minus electrode layer 206. The piezoelectric layers 41 in which the bending vibration is generated and the piezoelectric layers 41 in which the stretching vibration is generated are stacked to form the actuator body 204, thereby harmonically generating the stretching and bending vibrations in the entire actuator body 204. Consequently, orbit motion of driver elements 49 is provided, resulting in an output of drive force.

In such a configuration, two side electrodes are provided for each external electrode. Thus, even if one of the connecting parts between the external and side electrodes is damaged, conduction in another connecting part is maintained, thereby improving reliability of an ultrasonic actuator 2. For example, the two first side electrodes 71A and 71C are connected to the first external electrode 81A at the edges 40c and 40e. Even if the edge 40c is damaged, and the first external electrode 81A and the first side electrode 71A are disconnected from each other, the first external electrode 81A and the first side electrode 71C are connected. Thus, conduction between the first external electrode 81A and each of the first divided electrodes 51A are maintained.

<Third Variation>

Next, an ultrasonic actuator of a third variation will be described. The ultrasonic actuator of the third variation has a configuration of internal electrodes of an actuator body 304, which is different from the configuration of the internal electrode layers 5 and 6 of the actuator body 4.

Figure 13:
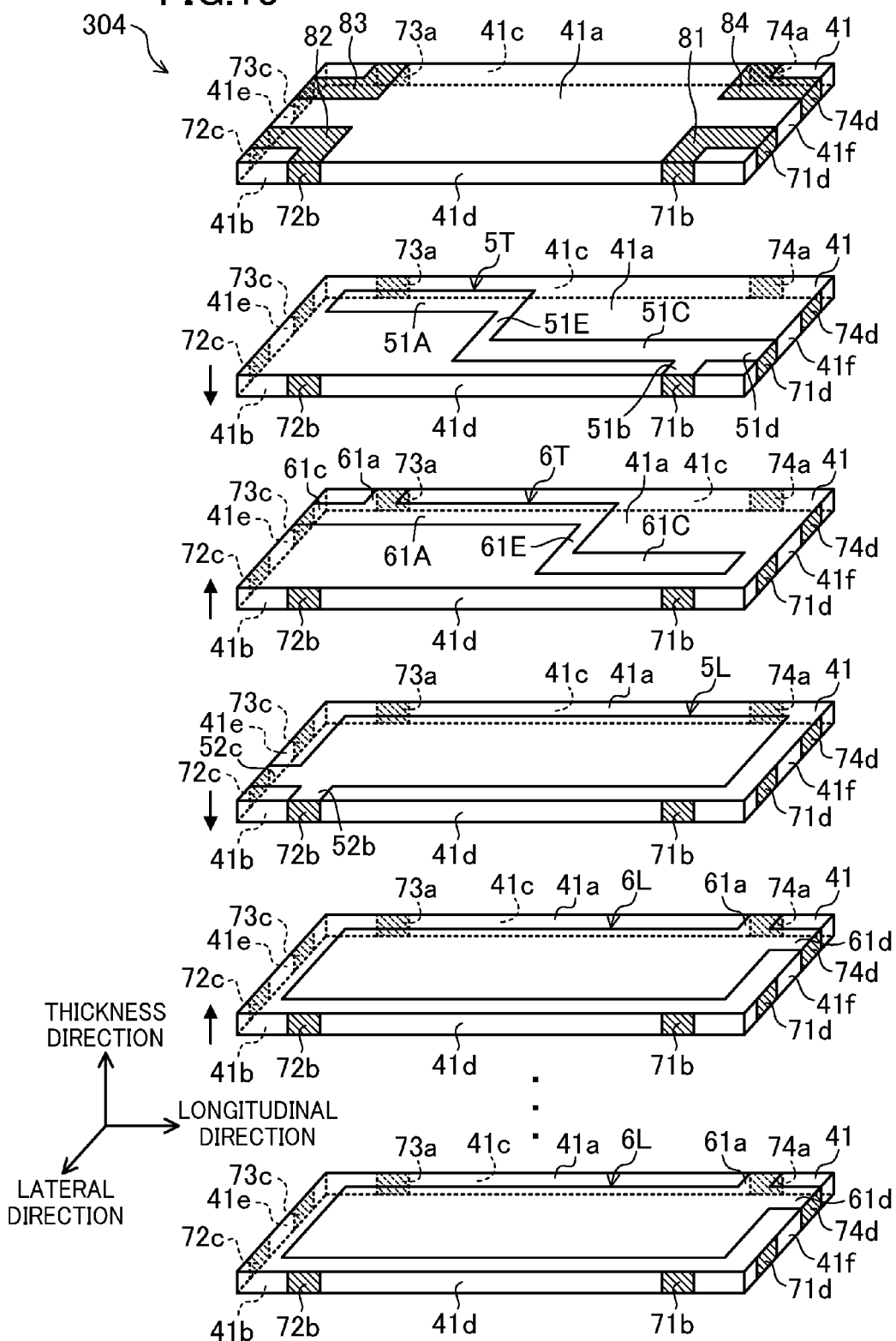
FIG. 13 is an exploded perspective view of an actuator body of a third variation.

As illustrated in FIG. 13, as internal electrode layers, the actuator body 304 includes first plus electrode layers 5T, second plus electrode layers 5L, first minus electrode layers 6T, and second minus electrode layers 6L. The first plus electrode layer 5T includes two first divided electrodes 51A and 51C provided in areas A1 and A3; and a connection electrode 51E connecting the first divided electrodes 51A and 51C together. The second plus electrode layer 5L is a single electrode formed across a substantially entire area of a principal surface 41a of a piezoelectric layer 41. The first minus electrode layer 6T includes two first divided opposite electrodes 61A and 61C provided in the areas A1 and A3; and a connection electrode 61E connecting the first divided opposite electrodes 61A and 61C together. As in the second plus electrode layer 5L, the second minus electrode layer 6L is a single electrode formed across a substantially entire area of the principal surface 41a of the piezoelectric layer 41. The connection electrode 51E of the first plus electrode layer 5T and the connection electrode 61E of the first minus electrode layer 6T are displaced from each other in the longitudinal direction, and are not overlapped with each other as viewed in the stacking direction. The first plus electrode layer 5T, the second plus electrode layer 5L, the first minus electrode layer 6T, and the second minus electrode layer 6L serve as internal electrodes. In addition, the first divided electrodes 51A and 51C serve as first electrodes, and the second plus electrode layer 5L serves as a second electrode arranged in a pattern different from that of the first divided electrodes 51A and 51C. Further, the first divided opposite electrodes 61A and 61C serve as first opposite electrodes, and the second minus electrode layer 6L serves as a second opposite electrode facing the second plus electrode layer 5L with the piezoelectric layer 41 being interposed therebetween.

The actuator body 304 is formed by stacking a plurality of piezoelectric layers 41 in the following order: the piezoelectric layer 41 on which the first plus electrode layer 5T is provided; the piezoelectric layer 41 on which the first minus electrode layer 6T is provided; the piezoelectric layer 41 on which the second plus electrode layer 5L is provided; and the piezoelectric layer 41 on which the second minus electrode layer 6L is provided.

On a long-side surface 41c of the piezoelectric layer 41, a third side electrode 73a is provided in one of end sections of the long-side surface 41c in the longitudinal direction, and a fourth side electrode 74a is provided in the other end section in the longitudinal direction. On a long-side surface 41d of the piezoelectric layer 41, a second side electrode 72b is provided in one of end sections of the long-side surface 41d in the longitudinal direction, and a first side electrode 71b is provided in the other end section in the longitudinal direction. On a short-side surface 41e of the piezoelectric layer 41, a third side electrode 73c is provided in one of end sections of the short-side surface 41e in the lateral direction, and a second side electrode 72c is provided in the other end section in the lateral direction. On a short-side surface 41f of the piezoelectric layer 41, a fourth side electrode 74d is provided in one of end sections of the short-side surface 41f in the lateral direction, and a first side electrode 71d is provided in the other end section in the lateral direction.

The first divided electrode 51C of the first plus electrode layer 5T includes a lead electrode 51b extending to the first side electrode 71b of the long-side surface 41d; and a lead electrode 51d extending to the first side electrode 71d of the short-side surface 41f. That is, the first divided electrode 51C is connected to the first side electrode 71b through the lead electrode 51b, and is connected to the first side electrode 71d through the lead electrode 51d.

The first divided opposite electrode 61A of the first minus electrode layer 6T includes a lead electrode 61a extending to the third side electrode 73a of the long-side surface 41c; and a lead electrode 61c extending to the third side electrode 73c of the short-side surface 41e. That is, the first divided opposite electrode 61A is connected to the third side electrode 73a through the lead electrode 61a, and is connected to the third side electrode 73c through the lead electrode 61c.

The second plus electrode layer 5L includes a lead electrode 52b extending to the second side electrode 72b of the long-side surface 41d; and a lead electrode 52c extending to the second side electrode 72c of the short-side surface 41e. That is, the second plus electrode layer 5L is connected to the second side electrode 72b through the lead electrode 52b, and is connected to the second side electrode 72c through the lead electrode 52c.

The second minus electrode layer 6L includes a lead electrode 61a extending to the fourth side electrode 74a of the long-side surface 41c; and a lead electrode 61d extending to the fourth side electrode 74d of the short-side surface 41f. That is, the second minus electrode layer 6L is connected to the fourth side electrode 74a through the lead electrode 61a, and is connected to the fourth side electrode 74d through the lead electrode 61d.

Figure 14:
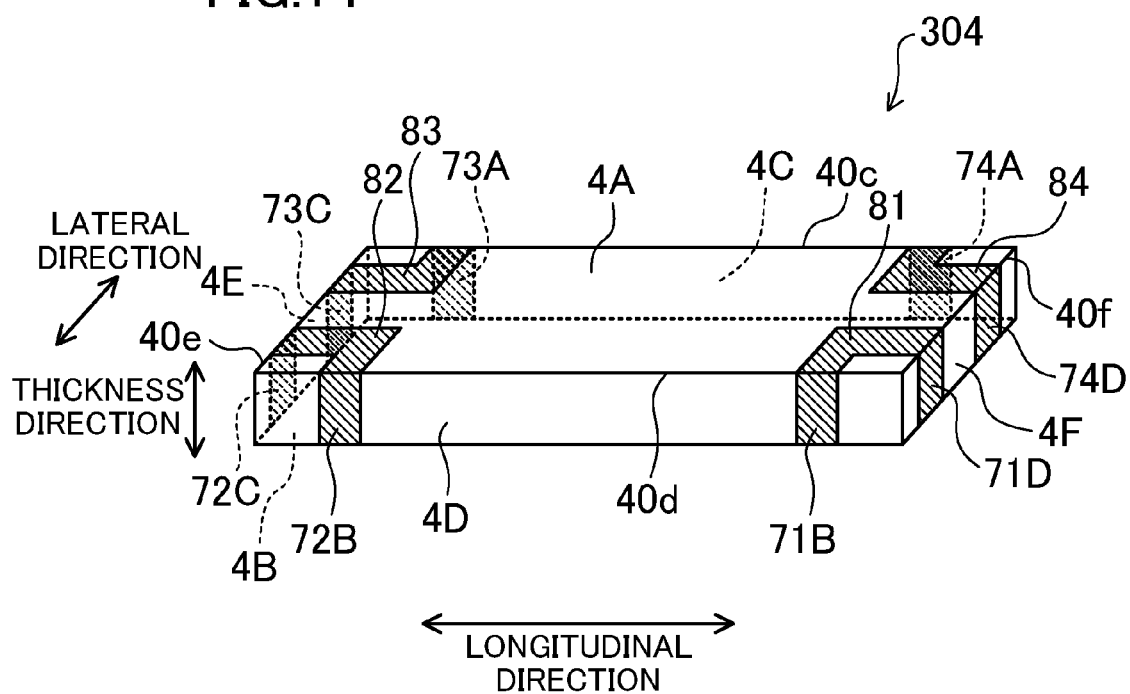
FIG. 14 is a perspective view of the actuator body of the third variation.

When stacking the piezoelectric layers 41 configured as described above, the first to fourth side electrodes 71b-74d formed on the side surfaces of the piezoelectric layers 41 are connected together in the stacking direction, and the integrally-connected first to fourth side electrodes 71B-74D are formed on the side surfaces of the body of the piezoelectric layers 41, i.e., the actuator body 304. Specifically, as illustrated in FIG. 14, on a long-side surface 4C of the actuator body 304, the followings are formed: a third side electrode 73A formed by connecting a plurality of third side electrodes 73a as a single group; and a fourth side electrode 74A formed by connecting a plurality of fourth side electrodes 74a as a single group. On a long-side surface 4D of the actuator body 304, the followings are formed: a second side electrode 72B formed by connecting a plurality of second side electrodes 72b as a single group; and a first side electrode 71B formed by connecting a plurality of first side electrodes 71b as a single group. On a short-side surface 4E of the actuator body 304, the followings are formed: a third side electrode 73C formed by connecting a plurality of third side electrodes 73c as a single group; and a second side electrode 72C formed by connecting a plurality of second side electrodes 72c as a single group. On a short-side surface 4F of the actuator body 304, the followings are formed: a fourth side electrode 74D formed by connecting a plurality of fourth side electrodes 74d as a single group; and a first side electrode 71D formed by connecting a plurality of first side electrodes 71d as a single group.

The followings are formed on the principal surface 41a exposed to an outside of the outermost piezoelectric layer 41 of the actuator body 304 (i.e., a principal surface 4A of the actuator body 304): a first external electrode 81 through which power is fed to the first plus electrode layers 5T; a second external electrode 82 through which power is fed to the second plus electrode layers 5L; a third external electrode 83 through which power is fed to the first minus electrode layers 6T; and a fourth external electrode 84 through which power is fed to the second minus electrode layers 6L. The first to fourth external electrodes 81-84 are arranged so as to be symmetrical about a line passing through the center of gravity of the principal surface 4A of the actuator body 304, and extending in the lateral direction.

The first external electrode 81 is formed in L-shape so as to surround a corner section of the principal surface 4A in an area A3 (see FIG. 4) of four areas which are formed by dividing the principal surface 4A of the actuator body 304 into two areas in the longitudinal and lateral directions. One end of the first external electrode 81 is connected to the first side electrode 71B of the long-side surface 4D, and the other end is connected to the first side electrode 71D of the short-side surface 4F. Specifically, the first external electrode 81 and the first side electrode 71B are connected together at a long-side edge 40d defined by the principal surface 4A and the long-side surface 4D of the actuator body 304. In addition, the first external electrode 81 and the first side electrode 71D are connected together at a short-side edge 40f defined by the principal surface 4A and the short-side surface 4F of the actuator body 304. The first external electrode 81 and the first side electrodes 71B and 71D connected together as described above are formed so as to cross the two edges 40d and 40f. Thus, the first external electrode 81 is in conduction with the first plus electrode layers 5T through the two first side electrodes 71B and 71D.

The second external electrode 82 is formed in L-shape so as to surround a corner section of the principal surface 4A in an area A4 (see FIG. 4) of the four areas which are formed by dividing the principal surface 4A of the actuator body 304 into two areas in the longitudinal and lateral directions. One end of the second external electrode 82 is connected to the second side electrode 72B of the long-side surface 4D, and the other end is connected to the second side electrode 72C of the short-side surface 4E. Specifically, the second external electrode 82 and the second side electrode 72B are connected together at the long-side edge 40d defined by the principal surface 4A and the long-side surface 4D of the actuator body 304. In addition, the second external electrode 82 and the second side electrode 72C are connected together at a short-side edge 40e defined by the principal surface 4A and the short-side surface 4E of the actuator body 304. The second external electrode 82 and the second side electrodes 72B and 72C connected together as described above are formed so as to cross the two edges 40d and 40e. Thus, the second external electrode 82 is in conduction with the second plus electrode layers 5L through the two second side electrodes 72B and 72C.

The third external electrode 83 is formed in L-shape so as to surround a corner section of the principal surface 4A in an area A1 (see FIG. 4) of the four areas which are formed by dividing the principal surface 4A of the actuator body 304 into two areas in the longitudinal and lateral directions. One end of the third external electrode 83 is connected to the third side electrode 73A of the long-side surface 4C, and the other end is connected to the third side electrode 73C of the short-side surface 4E. Specifically, the third external electrode 83 and the third side electrode 73A are connected together at a long-side edge 40c defined by the principal surface 4A and the long-side surface 4C of the actuator body 304. In addition, the third external electrode 83 and the third side electrode 73C are connected together at the short-side edge 40e defined by the principal surface 4A and the short-side surface 4E of the actuator body 304. The third external electrode 83 and the third side electrodes 73A and 73C connected together as described above are formed so as to cross the two edges 40c and 40e. Thus, the third external electrode 83 is in conduction with the first minus electrode layers 6T through the two third side electrodes 73A and 73C.

The fourth external electrode 84 is formed in L-shape so as to surround a corner section of the principal surface 4A in an area A2 (see FIG. 4) of the four areas which are formed by dividing the principal surface 4A of the actuator body 304 into two areas in the longitudinal and lateral directions. One end of the fourth external electrode 84 is connected to the fourth side electrode 74A of the long-side surface 4C, and the other end is connected to the fourth side electrode 74D of the short-side surface 4F. Specifically, the fourth external electrode 84 and the fourth side electrode 74A are connected together at the long-side edge 40c defined by the principal surface 4A and the long-side surface 4C of the actuator body 304. In addition, the fourth external electrode 84 and the fourth side electrode 74D are connected together at the short-side edge 40f defined by the principal surface 4A and the short-side surface 4F of the actuator body 304. The fourth external electrode 84 and the fourth side electrodes 74A and 74D connected together as described above are formed so as to cross the two edges 40c and 40f. Thus, the fourth external electrode 84 is in conduction with the second minus electrode layers 6L through the two fourth side electrodes 74A and 74D.

In the actuator body 304 configured as described above, the first to fourth external electrodes 81-84 are exposed to outside. Power is fed to the actuator body 304 by using the first to fourth external electrodes 81-84 as power feeding terminals. Specifically, a flexible printed board (not shown in the figure) is connected to the first to fourth external electrodes 81-84 on the principal surface 4A of the actuator body 304. First drive voltage is applied to the first plus electrode layers 5T and the first minus electrode layers 6T through the first and third external electrodes 81 and 83. This results in generation of bending vibration in the piezoelectric layer 41 sandwiched between the first plus electrode layer 5T and the first minus electrode layer 6T. In addition to the above, second drive voltage is applied to the second plus electrode layers 5L and the second minus electrode layers 6L through the second and fourth external electrodes 82 and 84 with its phase being shifted from a phase of the first drive voltage by 90°. This results in generation of stretching vibration in the piezoelec-tric layer 41 sandwiched between the second plus electrode layer 5L and the second minus electrode layer 6L. The piezoelectric layers 41 in which the bending vibration is generated and the piezoelectric layers 41 in which the stretching vibration is generated are stacked to form the actuator body 304, thereby harmonically generating the stretching and bending vibrations in the entire actuator body 304. Consequently, orbit motion of driver elements 49 is provided, resulting in an output of drive force.

In such a configuration, two side electrodes are provided for each external electrode. Thus, even if one of the connecting parts between the external and side electrodes is damaged, conduction in another connecting part is maintained, thereby improving reliability of an ultrasonic actuator 2. For example, the two first side electrodes 71B and 71D are connected to the first external electrode 81 at the edges 40d and 40f. Even if the edge 40d is damaged, and the first external electrode 81 and the first side electrode 71B are disconnected from each other, the first external electrode 81 and the first side electrode 71D are connected. Thus, conduction between the first external electrode 81 and each of the first plus electrode layers 5T are maintained.

Other Embodiments

The present disclosure may have the following configurations in the foregoing embodiments.

For example, the configuration of the actuator bodies 4, 104, 204, and 304 is not limited to the foregoing configurations. That is, the first-order stretching vibration and the second-order bending vibration are harmonically generated in each of the actuator bodies 4, 104, 204, and 304, but the present disclosure is not limited to such a configuration. Other order and other type of vibration may be harmonically generated.

The configuration of the internal electrode layers 5, 5T, 5L, 6, 206, 6T, and 6L is not limited to the foregoing configurations.

Two side electrodes are connected to each of the external electrodes, but the present disclosure is not limited to such a configuration. A plurality of side electrodes may be connected to each of the external electrodes, and a configuration may be employed, in which three or more side electrodes are connected to each of the external electrodes.

The plurality of side electrodes provided for each of the external electrodes may be provided at the same edge, or may be provided at edges parallel to each other.

The piezoelectric layers have the same thickness, but may have different thicknesses. In particular, the thickness of the outermost piezoelectric layer is preferably thicker than that of the other piezoelectric layer. This reduces generation of unnecessary vibration in the outermost piezoelectric layer by the external electrodes.

The external and side electrodes are preferably connected together in sections near the nodes of the bending vibration. In particular, each of the actuator bodies 4, 104, 204, and 304 is bent and deformed at the long-side edges 40c and 40d by the bending vibration of each of the actuator bodies 4, 104, 204, and 304. Thus, when the external and side electrodes are connected together at the long-side edges 40c and 40d, such electrodes are preferably connected in the sections near the nodes of the bending vibration. Since stress is less likely to be generated in the sections corresponding to the nodes, a possibility of damage in the connecting parts between the external and side electrodes can be further reduced.

The external electrodes 81, 82, etc. are formed in L-shape, and are not formed in the corner sections of the principal surface 4A of, e.g., the actuator body 4. However, even if the external electrode is formed in the corner section, the similar features and advantages can be realized.

As a method for feeding power to each of the actuator bodies 4, 104, 204, and 304, a power feeding method other than the method using the flexible printed board 9 may be used, which includes, e.g., a method using wires, and a method using contact pins. In such cases, advantages similar to those of the foregoing embodiments can be realized.

Figure 15:
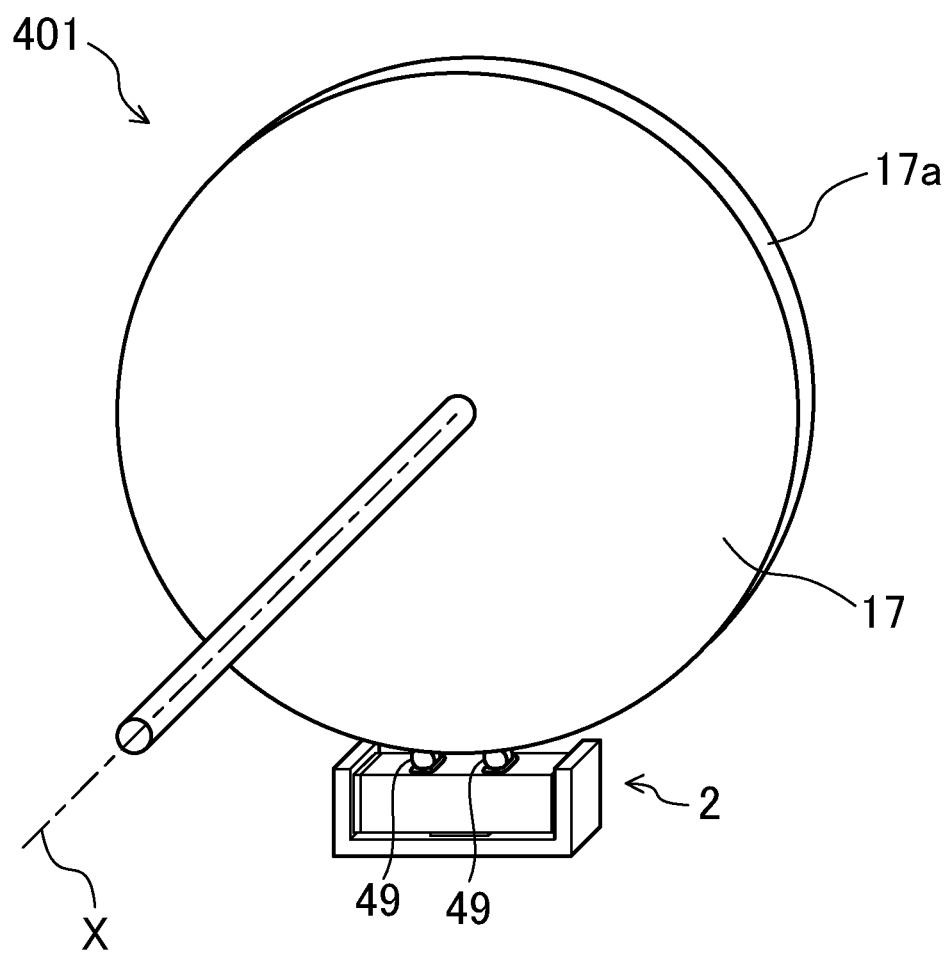
FIG. 15 is a perspective view of a drive unit of other embodiment.
Figure 16:
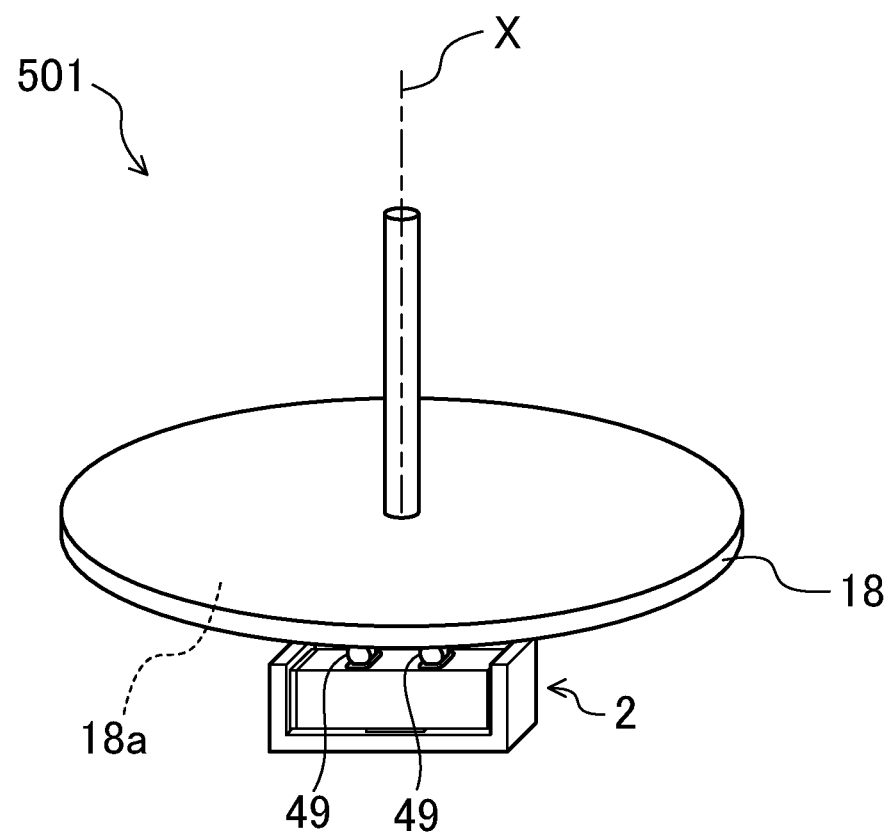
FIG. 16 is a perspective view of a drive unit of another embodiment.

In the foregoing embodiments, the movable body driven by the drive force of the ultrasonic actuator 2 is the plate-like stage 11, but the present disclosure is not limited to such a configuration. Any configuration of the movable body may be employed. As illustrated in, e.g., FIG. 15, a drive unit 401 may be employed, in which a movable body is a circular body 17 which is rotatable about a predetermined axis X, and driver elements 49 of an ultrasonic actuator 2 contact a circumferential surface 17a of the circular body 17. In such a configuration, when driving the ultrasonic actuator 2, substantially elliptical motion of the driver elements 49 rotates the circular plate 17 about the predetermined axis X. In addition, as illustrated in FIG. 16, a drive unit 501 may be employed, in which a movable body is a circular body 18 which is rotatable about a predetermined axis X, and driver elements 49 of an ultrasonic actuator 2 contact a flat section 18a of the circular body 18. In such a configuration, when driving the ultrasonic actuator 2, substantially elliptical motion of the driver elements 49 drives the circular body 18 in a tangential direction of portions contacting the driver elements 49, resulting in an rotation of the circular body 18 about the predetermined axis X.

In the foregoing embodiments, the configuration has been described, in which the driver elements 49 are attached to the long-side surface 4C of each of the actuator bodies 4, 104, 204, and 304. However, the driver elements 49 may be attached to the short-side surface 4E (4F) of each of the actuator bodies 4, 104, 204, and 304. In such a case, the direction of the first-order stretching vibration is a direction in which the driver elements 49 are perpendicular to the stage 11, and the direction of the second-order bending vibration is a traveling direction of the stage 11.

As described above, the present disclosure is useful for the vibratory actuator including the actuator body in which the plurality of piezoelectric layers are stacked.

The description of the embodiments of the present disclosure is given above for the understanding of the present disclosure. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A vibratory actuator, comprising:
a body including a plurality of piezoelectric layers stacked in a stacking direction; and internal electrodes, each of which is sandwiched between the piezoelectric layers,
wherein external electrodes through which power is fed from outside are provided on a principal surface exposed to an outside of the outermost piezoelectric layer;
the body has side surfaces which are parallel to the stacking direction, and side electrodes provided on the side surfaces;
the side electrodes are connected to the internal electrodes, and are connected to the external electrode at an edge defined by the side surface and the principal surface on which the external electrode is provided; and
at least one of the external electrodes is connected to a corresponding one or more of the internal electrodes through two or more of the side electrodes.

2. The vibratory actuator of claim 1, wherein
the internal electrodes include a first electrode arranged on the principal surface of the piezoelectric layer, a first opposite electrode facing the first electrode with the piezoelectric layer being interposed therebetween, a second electrode arranged on the principal surface of the piezoelectric layer in a pattern different from that of the first electrode, and a second opposite electrode facing the second electrode with the piezoelectric layer being interposed therebetween;
the external electrodes include a first external electrode through which power is fed to the first electrode, a first opposite external electrode through which power is fed to the first opposite electrode, a second external electrode through which power is fed to the second electrode, and a second opposite external electrode through which power is fed to the second opposite electrode;
the first electrode and the first external electrode are connected together by the two or more side electrodes;
the first opposite electrode and the first opposite external electrode are connected together by two or more side electrodes;
the second electrode and the second external electrode are connected together by two or more side electrodes; and
the second opposite electrode and the second opposite external electrode are connected together by two or more side electrodes.

3. The vibratory actuator of claim 1, wherein
the two or more side electrodes connecting between the at least one of the external electrodes and the corresponding one or more of the internal electrodes are connected to the at least one external electrode at different edges defined by the principal surface and the side surfaces.

4. A vibratory actuator, comprising:
a body including a plurality of piezoelectric layers stacked in a stacking direction; and internal electrodes, each of which is sandwiched between the piezoelectric layers,
wherein external electrodes through which power is fed from outside are provided on a principal surface exposed to an outside of the outermost piezoelectric layer;
the body has side surfaces which are parallel to the stacking direction, and side electrodes provided on the side surfaces;
the side electrodes are connected to the internal electrodes, and are connected to the external electrode at an edge defined by the side surface and the principal surface on which the external electrode is provided; and
the internal and external electrodes which are at the same potential are connected together by a plurality of side electrodes,
wherein the plurality of side electrodes connecting between the internal and external electrodes which are at the same potential are connected to the external electrode at least two edges of the edges defined by the principal surface and the side surfaces, which are not parallel to each other.

5. The vibratory actuator of claim 1, wherein,
on the principal surface, the external electrodes are arranged so as to be symmetrical about a line passing through the center of gravity of the principal surface.

6. The vibratory actuator of claim 1, wherein
the body generates a plurality of vibrations including bending vibration in a lateral direction of the principal surface in order to output drive force in a predetermined drive direction; and
the external electrodes are arranged in sections corresponding to nodes of the bending vibration.

7. The vibratory actuator of claim 1, wherein
the body generates a plurality of vibrations in order to output drive force in a predetermined drive direction;
power feeding lines are connected to the external electrodes; and
the power feeding lines extend from the external electrodes in the drive direction.

8. The vibratory actuator of claim 2, wherein
the first and second opposite electrodes are connected together to serve as a single opposite electrode;
the first and second opposite external electrodes are integrated to serve as a single opposite electrode common to the first and second electrodes; and
the length of the connecting part between the opposite external electrode and the side electrode along the edge is longer than the length of the connecting part between the first or second external electrode and the side electrode along the edge.

* * * * *